(12) United States Patent
Sueda et al.

(10) Patent No.: US 9,234,103 B2
(45) Date of Patent: Jan. 12, 2016

(54) FILLER PARTICLES, RESIN COMPOSITION, GREASE, AND COATING COMPOSITION

(71) Applicant: Sakai Chemical Industry Co., Ltd., Sakai-Shi, Osaka (JP)

(72) Inventors: Satoru Sueda, Iwaki (JP); Atsuki Terabe, Iwaki (JP); Hiroyuki Izumikawa, Iwaki (JP); Mitsuo Hashimoto, Iwaki (JP)

(73) Assignee: Sakai Chemical Industry Co., Ltd., Osaka (JP)

( * ) Notice: Subject to any disclaimer, the term of this patent is extended or adjusted under 35 U.S.C. 154(b) by 298 days.

(21) Appl. No.: 13/661,465

(22) Filed: Oct. 26, 2012

(65) Prior Publication Data

US 2013/0072406 A1 Mar. 21, 2013

Related U.S. Application Data

(63) Continuation-in-part of application No. PCT/JP2011/059002, filed on Apr. 11, 2011, which is a continuation-in-part of application No. PCT/JP2011/058779, filed on Apr. 7, 2011.

(30) Foreign Application Priority Data

Apr. 26, 2010 (JP) .................................. 2010-101500

(51) Int. Cl.
*C09C 1/04* (2006.01)
*C01G 9/02* (2006.01)
(Continued)

(52) U.S. Cl.
CPC ... *C09C 1/04* (2013.01); *C01G 9/00* (2013.01); *C01G 9/02* (2013.01); *C08J 5/18* (2013.01);
(Continued)

(58) Field of Classification Search
CPC ............ C09C 1/04; C09C 1/043; C01G 9/00; C01G 9/02; C01P 2002/50; C01P 2002/52; C01P 2002/03; C01P 2002/04; C01P 2002/34; C01P 2002/10; C01P 2002/11; C01P 2002/40; C01P 2002/54; C01P 2006/11; C01P 2006/40; C10M 103/06; C10M 2201/0626; C10N 2210/01; C10N 2210/02; C10N 2220/082; C10N 2230/60; C10N 2240/201; C10N 2240/202; C10N 2250/10; C10N 2250/12; C08K 3/22; C08L 91/00; C09D 7/1216; C09D 11/037; H01L 31/048; Y02E 10/50; C08J 5/18
USPC ................... 508/170, 172; 420/513, 521, 522
See application file for complete search history.

(56) References Cited

U.S. PATENT DOCUMENTS 5,344,636 A * 9/1994 Miyata .......................... 424/688
5,672,427 A 9/1997 Hagiwara et al.
(Continued)

FOREIGN PATENT DOCUMENTS

CA 2741218 A1 4/2011
CN 1610725 A 4/2005
(Continued)

*Primary Examiner* — James Goloboy
(74) *Attorney, Agent, or Firm* — Novak Druce Connolly Bove + Quigg LLP

(57) ABSTRACT

The object of the present disclosure is to obtain a filler particle having stable insulation property, and a resin composition, grease, and a coating composition comprising the same, respectively. Filler particles comprising a composite zinc oxide expressed by the following chemical formula (1):

$$Zn_xM_yO \qquad (1)$$

in the formula, M is Mg, Co, Li, K, Na, or Cu, and $x+ny/2=1$ when the valence of M is n.

4 Claims, 28 Drawing Sheets

(51) Int. Cl.
  *C10M 103/06* (2006.01)
  *C01G 9/00* (2006.01)
  *C08L 91/00* (2006.01)
  *C09D 7/12* (2006.01)
  *H01L 31/048* (2014.01)
  *C09D 11/037* (2014.01)
  *C08J 5/18* (2006.01)
  *C08K 3/22* (2006.01)

(52) U.S. Cl.
  CPC .............. *C08L 91/00* (2013.01); *C09C 1/043* (2013.01); *C09D 7/1216* (2013.01); *C09D 11/037* (2013.01); *C10M 103/06* (2013.01); *H01L 31/048* (2013.01); *C01P 2002/50* (2013.01); *C01P 2002/52* (2013.01); *C01P 2002/54* (2013.01); *C01P 2004/03* (2013.01); *C01P 2004/04* (2013.01); *C01P 2004/34* (2013.01); *C01P 2006/10* (2013.01); *C01P 2006/11* (2013.01); *C01P 2006/40* (2013.01); *C08K 3/22* (2013.01); *C10M 2201/0626* (2013.01); *C10N 2210/01* (2013.01); *C10N 2210/02* (2013.01); *C10N 2220/082* (2013.01); *C10N 2230/60* (2013.01); *C10N 2240/20* (2013.01); *C10N 2240/201* (2013.01); *C10N 2240/202* (2013.01); *C10N 2250/10* (2013.01); *C10N 2250/12* (2013.01); *Y02E 10/50* (2013.01)

(56) References Cited

U.S. PATENT DOCUMENTS

| | | | |
|---|---|---|---|
| 8,216,544 | B2 | 7/2012 | Ando et al. |
| 2005/0261140 | A1* | 11/2005 | Yamada et al. ............... 508/150 |
| 2007/0154561 | A1* | 7/2007 | Takeda et al. ................ 424/489 |
| 2010/0320091 | A1 | 12/2010 | Takaki et al. |
| 2013/0149534 | A1 | 6/2013 | Shibata |

FOREIGN PATENT DOCUMENTS

| | | |
|---|---|---|
| JP | 8-310813 A | 11/1996 |
| JP | 10-330603 A | 12/1998 |
| JP | 2007-084704 A | 4/2007 |
| JP | 2007-106809 A | 4/2007 |
| JP | 2008-266445 A | 11/2008 |
| JP | 2009-249226 A | 10/2009 |
| WO | WO-03/057782 A1 | 7/2003 |

* cited by examiner

20 μm

20 μm

20 μm

20 μm

20 μm

20 μm

20 μm

20 μm

20 μm

20 μm

5 μm

5 μm

5 μm

5 μm

20 μm

20 μm

FILLER PARTICLES, RESIN COMPOSITION, GREASE, AND COATING COMPOSITION

CROSS REFERENCE TO RELATED APPLICATIONS

This application is a Continuation-in-Part of Application No. PCT/JP2011/059002 filed on Apr. 11, 2011, and claims the benefit of Application No. PCT/JP2011/058779 filed on Apr. 7, 2011 under 35 U.S.C. §365, and the benefit of priority to Application No. 2010-101500 filed in Japan on Apr. 26, 2010 under 35 U.S.C. §119; the entire contents of each application is hereby incorporated by reference.

TECHNICAL FIELD

The present disclosure relates to filler particles comprising low-conductive zinc oxide particles, a resin composition, grease, and a coating composition.

BACKGROUND OF THE DISCLOSURE

Zinc oxide particles are widely used as filler particles in the fields such as resins, coating compositions, and greases. Such zinc oxide particles being as the filler particles are expected to have various functions. As one of features of the zinc oxide particles, there is the high conductive property.

The high conductive property causes no particular problem according to the application, but there is a difficult purpose to use the zinc oxide particles as the filler because the conductive property causes adverse effect on the use as the filler. It's often the case that the conductive property brings undesirable consequence especially in the fields of electronic materials and electronic products. Therefore, zinc oxide particles with suppressed the conductive property are expected.

As the zinc oxide particles with suppressed the conductive property, the particles disclosed in Patent Document 1 are known. Patent Document 1 discloses the zinc oxide powder of which outer periphery is modified to a high-resistivity layer by doping with the use of a monovalent dopant.

Patent Document 2 discloses zinc oxide particles suitable for the purpose as a varistor powder, and that various metals are added in definite proportion. However, concerning the zinc oxide particles disclosed in the document, the use as the varistor powder is disclosed not the use as the filler. Furthermore, the document discloses that other metals may be added but it is not able to suppress the conductive property sufficiently because aluminum is used as an essential component so that the insulation property is likely to foe reduced. That is, a career which carries an electric charge of ZnO is a free electron, and shows N-type semiconductor character. It is thought that the conductive property may be increased because $Al^{3+}$ acts as a donor which gives a free electron to $Zn^{2+}$ to increase the free electrons of ZnO when $Al^{3+}$ is added to ZnO.

Patent Document 3 discloses an orientational zinc oxide-based piezoelectric material. However, the zinc oxide disclosed in Patent Document 3 is a zinc oxide being the piezoelectric material, there is no description about the use as the filler.

PRIOR TECHNICAL DOCUMENT

Patent Document

[Patent Document 1] Japanese Kokai Publication 2007-84704

[Patent Document 2] Japanese Kokai Publication 2008-218749

[Patent Document 3] Japanese Kokai Publication Hei8-310813

SUMMARY OF INVENTION

Problem to be Solved by the Invention

The object of the present disclosure which has been in view of the above-mentioned state of the art, is to obtain a filler particle having stable insulation property, and a resin composition, grease and a coating composition comprising the same, respectively.

Means for Solving Object

The present disclosure relates to a filler particle comprising a composite zinc oxide expressed by the following chemical formula (1):

in the formula, M is Mg, Co, Li, K, Na or Cu, and $x+ny/2=1$ when the valence of M is n.

In the filler particles, n and y preferably satisfy the following relational expression:

$$0.0001 < ny/2 < 0.3$$

The present disclosure relates to a resin composition comprising the filler particle.

The present disclosure relates to a grease comprising the filler particle.

The present disclosure relates to a coating composition comprising the filler particle.

Effect of the Invention

The filler of the present disclosure is the one of which the insulation property is increased while maintaining the original characteristics of zinc oxides, so it may be used suitably as a filler especially in the fields that need high-insulation property such as electronic devices. This will enable to obtain a resin composition, a grease, and a coating composition which have high insulation property.

EMBODIMENTS

In the following, the present disclosure is described in detail.

The present disclosure relates to a filler particle comprising a composite zinc oxide expressed by $Zn_xM_yO$ (in the formula, M is Mg, Co, Li, K, Na or Cu, and $x+ny/2=1$ when the valence of M is n). That is, the filler particle of the present disclosure is a filler particle comprising a composite zinc oxide containing at least one metal selected from the group consisting of Mg, Co, Li, K, Na and Cu.

In the present disclosure, part or all of the metallic element expressed by M exists uniformly inside of the zinc oxide particle. That is, the present disclosure relates to a filler particle comprising a composite oxide expressed by $Zn_xM_yO$. Zinc oxide particle cannot be used in the purpose that needs the insulation property, because it is a particle having the high-conductive property as mentioned above. On the other hand, if at least one metal selected form the group consisting of Mg, Co, Li, K, Na, and Cu is added at a constant rate, the added metal is contained inside the zinc oxide particle in the solid solution state that the added metal is uniformly-distributed. Therefore, the present disclosure has been achieved by founding that the insulation property of the zinc oxide particle is increased so that the particle can be used in the purpose that needs the insulation property.

In this way, a composite zinc oxide in the solid solution state that the added metal is uniformly-distributed can be obtained when the specified metal is M. The high-insulation property can be obtained if a metallic element which becomes the uniform solid solution condition is contained, the increasing effect of the insulation property may not be obtained sufficiently if the other metallic elements are contained. It is preferred especially that aluminum and so on being undesirable metallic elements in terms of the insulation property are not added positively, and that aluminum is not contained substantively. More specifically, the contained amount is preferably 0.0001 weight % or less in terms of $Al^{3+}$ relative to the weight of the zinc oxide particles.

In the present disclosure, the composite zinc oxide in the solid solution state that the added metal is uniformly-distributed preferably has the following Δ (%) of less than 60%.

(The Measurement Method of Δ (%))

Figure 7:
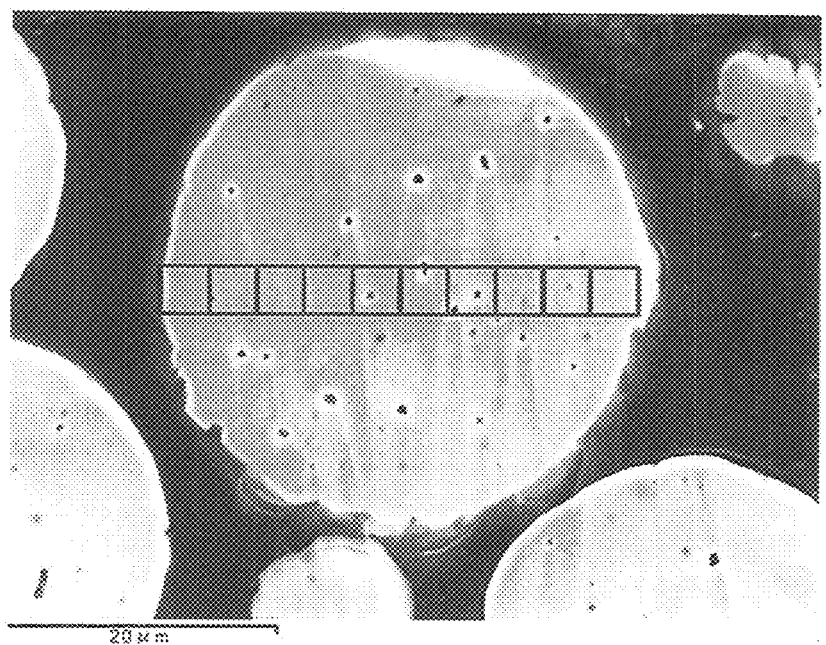
FIG. 7 is an image showing the part where a quantitative analysis of Zn and Mg at the section of filler particles of the present disclosure obtained in example 1 was performed by energy dispersive X-ray analysis.

As showed in FIG. 7, 10 squares were made by separating in diametrical direction on the image of the section of the filler particle. These squares were numbered, being 1, 2, 3, 4, 5, 6, 7, 8, 9, and 10 from the left in FIG. 7 and a quantitative analysis value Q (weight %) of the metal M in terms of oxide relative to ZnO 100 weight % in every square was measured from the quantitative analysis value (weight %) of Zn and the metal M in the every square. Moreover, the difference Δ (%) between the quantitative analysis value Q (weight %) of the metal M in terms of oxide in the squares 1 to 10 and the average value A (weight %) of the quantitative analysis values of the metal M in terms of oxide in the squares 1 to 10 was measured according to the following formula.

$$\Delta(\%)=|Q-A|/A\times100$$

At this time,

Q: the quantitative analysis value (weight %) of the metal M in terms of oxide relative to ZnO 100 weight % in every square 1 to 10

A: the average value (weight %) of the quantitative analysis values of the metal M in terms of oxide in every square 1 to 10

Δ(%) is preferably less than 60% in all the squares when the Δ(%) of all the squares is measured in this way.

In the documents mentioned above as the prior art, it is disclosed that other metals are mixed in the zinc oxide in the other fields than a filler. However, there are not many obtained zinc oxide having the constitution expressed by a general formula $Zn_xM_yO$, the above-mentioned knowledge has not been completely unknown until now.

Hereinafter, we will provide an explanation with images of the section of the filler particles in examples showed in figures to make this point more clear.

Figure 3:
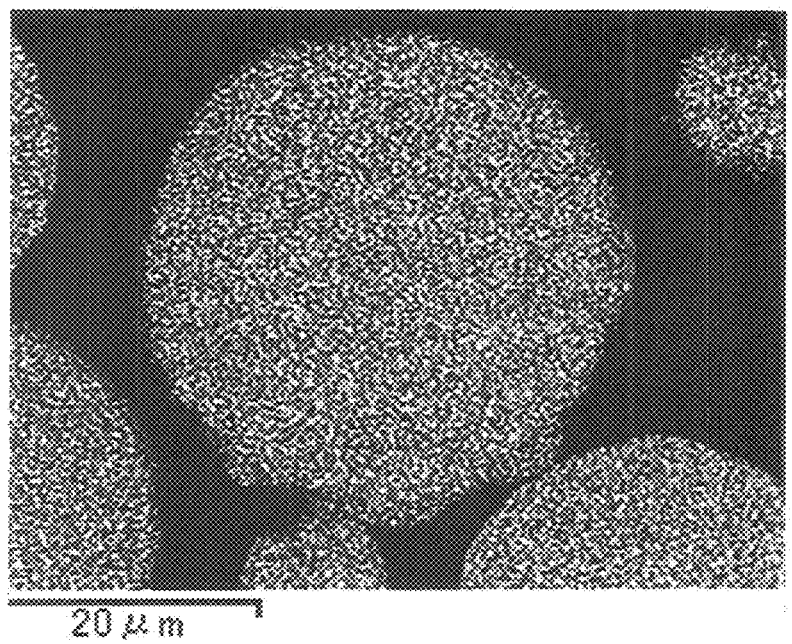
FIG. 3 is an image showing Zn mapping obtained by wavelength dispersive X-ray analysis at the section of filler particles of the present disclosure obtained in example 1.
Figure 4:
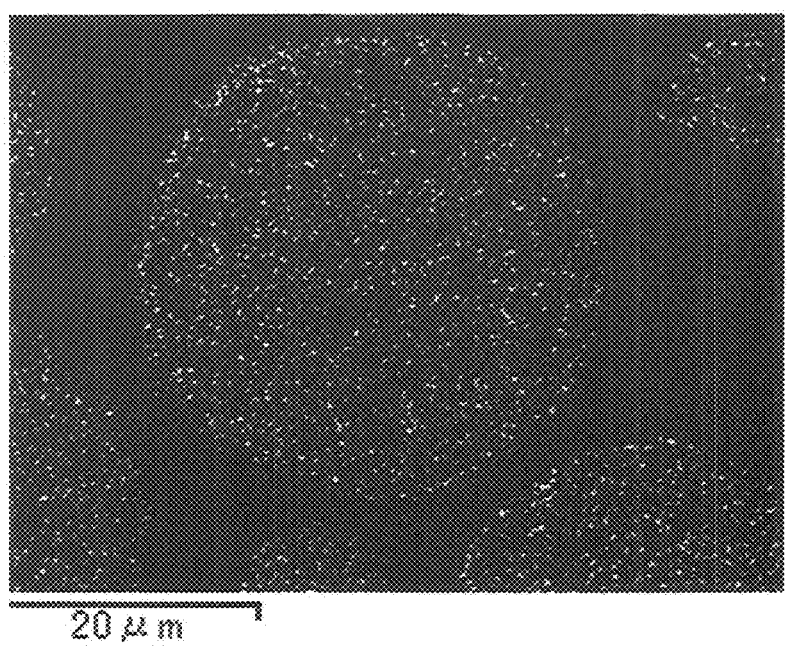
FIG. 4 is an image showing Mg mapping obtained by wavelength dispersive X-ray analysis at the section of filler particles of the present disclosure obtained in example 1.
Figure 5:
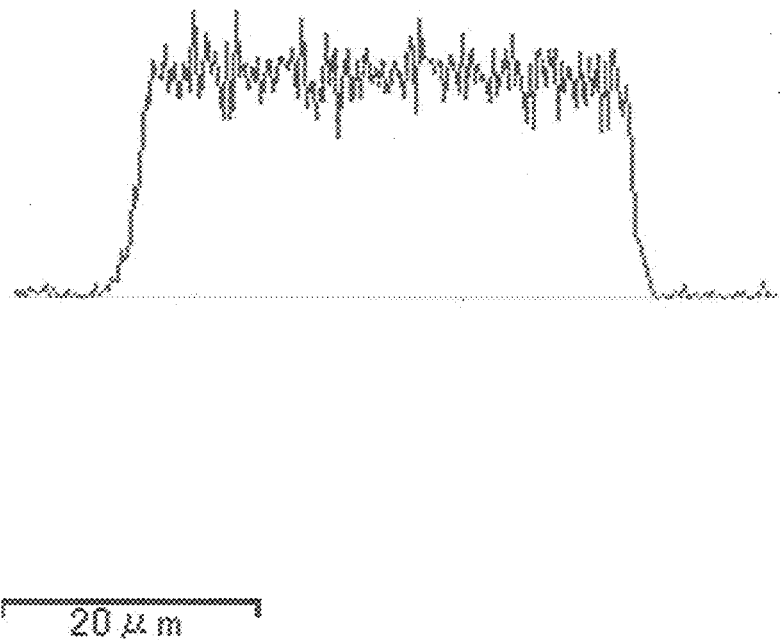
FIG. 5 is an image showing the line strength of Zn at the section of filler particles of the present disclosure obtained in example 1 determined by wavelength dispersive X-ray analysis.
Figure 6:
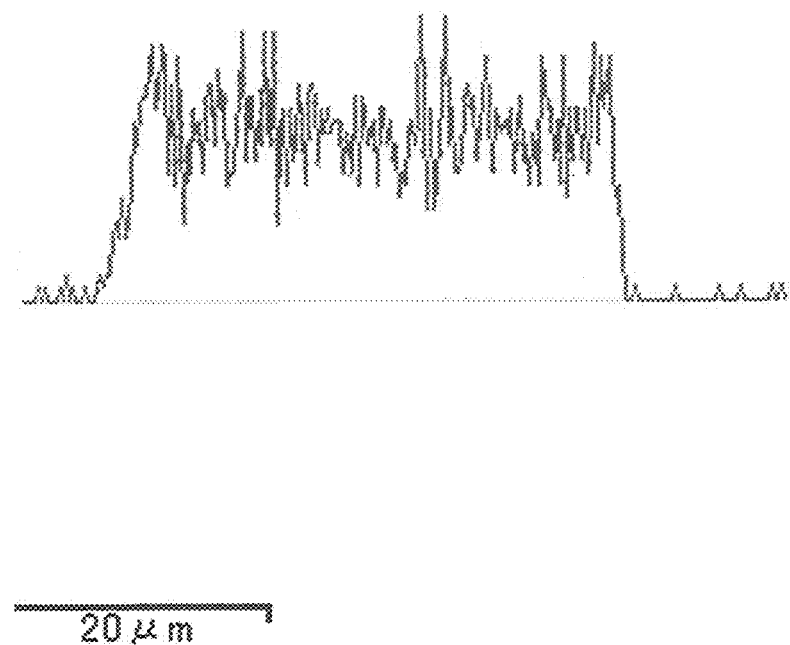
FIG. 6 is an image showing the line strength of Mg at the section of filler particles of the present disclosure obtained in example 1 determined by wavelength dispersive X-ray analysis.

FIGS. 3 and 4 are mapping images showing the existing points of Zn and Mg obtained by mapping the section of the filler particles of example 1 (zinc oxide particle in which Mg exists uniformly inside the particle) according to wavelength dispersive X-ray analysis. FIGS. 5 and 6 are images showing the strength of Zn and Mg existing on a straight line at the center of the figure on the section of the filler particles of example 1, respectively.

Figure 45:
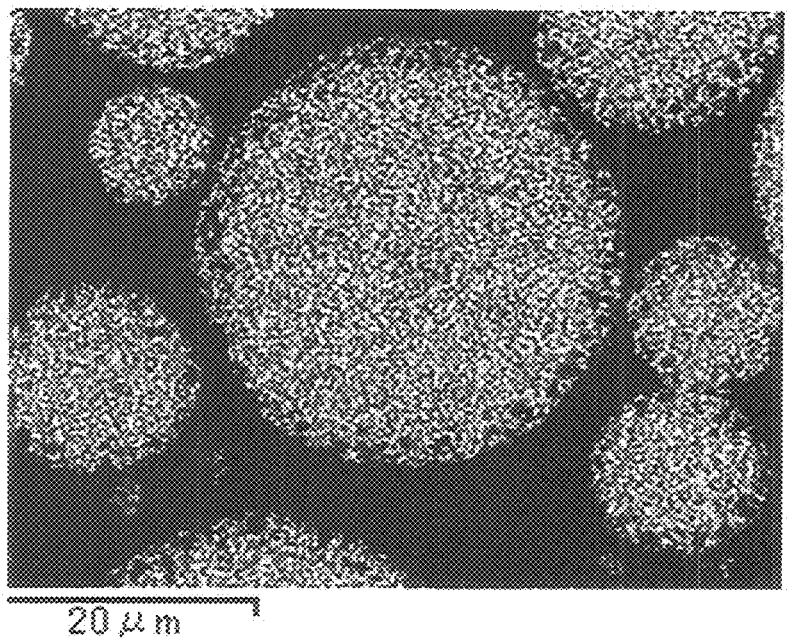
FIG. 45 is an image showing Zn mapping obtained by wavelength dispersive X-ray analysis at the section of filler particles of the present disclosure obtained in comparative example 2.
Figure 46:
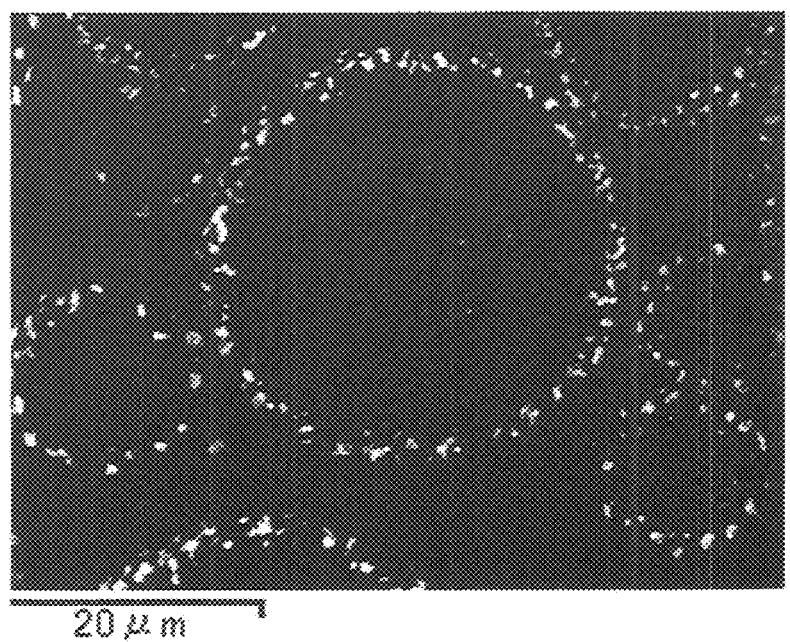
FIG. 46 is an image showing Ca mapping obtained by wavelength dispersive X-ray analysis at the section of filler particles of the present disclosure obtained in comparative example 2.
Figure 47:
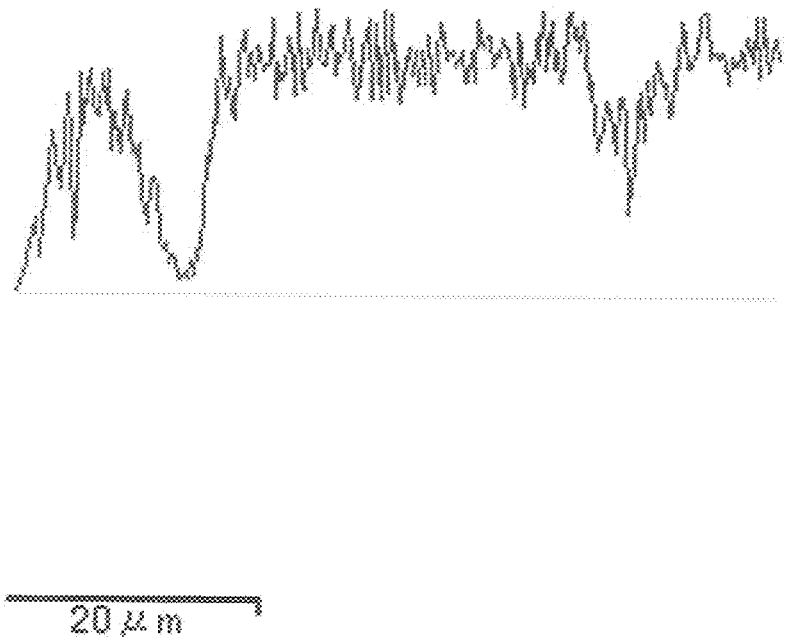
FIG. 47 is an image showing the line strength of Zn at the section of filler particles of the present disclosure obtained in comparative example 2 determined by wavelength dispersive X-ray analysis.
Figure 48:
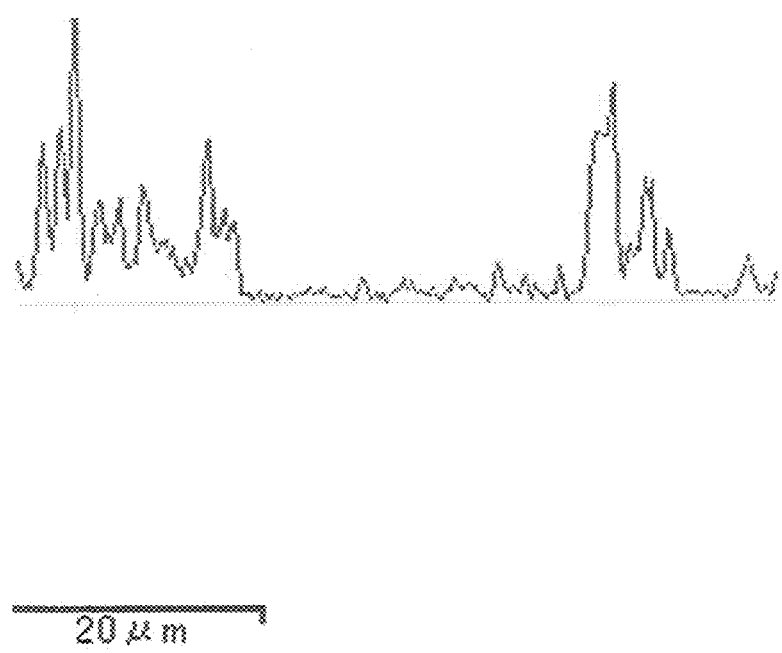
FIG. 48 is an image showing the line strength of Ca at the section of filler particles of the present disclosure obtained in comparative example 2 determined by wavelength dispersive X-ray analysis.

FIGS. 45 and 46 are mapping images showing the existing points of Zn and Ca obtained by mapping the section of the filler particles of comparative example 2 (zinc oxide particle in which Ca exists inside the particle) according to wavelength dispersive X-ray analysis. FIGS. 47 and 48 are images showing the strength of Zn and Ca existing on a straight line at the center of the figures on the section of the filler particles of comparative example 2.

The white spots on the figure showing the mapping image indicate that Zn, Mg, and Ca exist, respectively; the corrugated spectrum on the figure showing the line strength indicates the strength of Zn, Mg, and Ca existing on a straight line at the center of the figure.

From FIGS. 3, 4, 5, and 6, it is clear that Mg exists uniformly inside the zinc oxide particle in reference to the filler particle of the present disclosure of example 1. On the other hand, it is clear that Ca eccentrically-locates at the surface layer of the particles in reference to the filler particles of comparative example 2 shown in FIGS. 45, 46, 47, and 48. Moreover, in reference to the filler particle of comparative example 3 shown in FIGS. 52, 53, 54, and 55, Ni exists inside the particle but they eccentrically locate inside the particle not uniformly. That is, when Mg is used as the metal species, the filler particle of the present disclosure can be obtained as a particle comprising the complete composite zinc oxide in the uniform solid solution state; when Ca or Ni is used as the metal species, the metal cannot be dissolved uniformly and eccentrically-locates inside the particle or at the surface layer of the particle.

Furthermore, likewise when Co, Cu, or Na is used as the metal M, it is clear that M exists uniformly inside the zinc oxide particle from the FIGS. 10, 11, 12, 13, 38, 39, 40, and 41 (in the case of Co); FIGS. 19, 20, 21, and 22 (in the case of Na); FIGS. 25, 26, 27, and 28 (in the case of Cu).

In the chemical formula (1), if the valence of M is n, $x+ny/2=1$, preferably $0.0001<ny/2<0.3$. When $ny/2$ is less than 0.0001, the sufficient insulation performance may not be obtained. When $ny/2$ is 0.3 or more, the heat releasing performance may be reduced. The value of $ny/2$ more preferably satisfies the relation that $0.0001<ny/2<0.2$, still more preferably the relation that $0.0001<ny/2<0.06$.

The M is at least one metal element selected from the group consisting of Mg, Co, Li, K, Ma, and Cu. Among them, Mg and Co are preferred because they are superior in the insulation performance. The filler particle of the present disclosure may contain two or more metal elements as the M. When two or more metals are used as the M, $x+\Sigma(ny/2)=1$, and the value of $\Sigma(ny/2)$ is preferably within the above value range.

The filler particle of the present disclosure has significantly higher insulation property when compared to a highly-pure zinc oxide. If the filler particles of 62.9 volume % are filled up as a heat releasing material into a resin which having specific volume resistance value of $10^{15}$ Ω·cm when molded into a sheet shape, it is preferred that the specific volume resistance value of the obtained sheet can be maintained at a level of $10^{11}$ Ω·cm or more.

The filler particle of the present disclosure may have arbitrary shape, particle diameter, and so on. The shape includes arbitrary shapes such as needle shape, bar shape, plate-like shape, and spherical shape. The particle diameter is not particularly limited but it is preferred that the median size (D50) is within the range of 1 to 10000 μm, being the usual particle diameter of the zinc oxide used as a filler. The median size (D50) is measured by laser diffraction/scattering particle size distribution analyser LA-750 (manufactured by HORIBA, Ltd.). The particle diameter is more preferably 1 to 100 μm.

A method for producing the filler particle of the present disclosure is not particularly limited but the filler particle can be produced by adding a predetermined amount of a compound containing the metal M on either process in the usual method for producing a zinc oxide. For example, the zinc oxide particle disclosed in Japanese Kokai Publication 2009-249226 and other zinc oxide particles may be mentioned as the known zinc oxide particle, the above-mentioned filler particle can be obtained by adding a predetermined amount of a compound containing the metal M on either process in the methods for producing these zinc oxide particles.

Among them, the filler particle of the present disclosure is preferably filler particles (A) having a density of 4.0 g/cm³ or more and a median size (D50) of 17 to 10000 μm or filler particles (B) having a median size (D50) of 1 to 20 μm and D90/D10 of 4 or less. The filler particle (A) and (B) have superior insulation property. Hereinafter, these filler particles will be described in detail.

(Filler Particle (A))

The filler particle (A) can be obtained by a method for producing a zinc oxide particle, comprising a step (1) of mixing a source of the zinc oxide particle with a metal compound containing at least one metal element selected from the group consisting of Mg, Co, Li, K, Na, and Cu to granulate, and a step (2) of calcinating the granulated particle obtained in the step (1). The step (1) is a step of re-pulping a source of the zinc oxide particle in water and mixing with a metal compound containing at least one metal element selected from the group consisting of Mg, Co, Li, K, Na, and Cu to granulate.

In the method for producing the filler particle (A) of the present disclosure, a source of the zinc oxide particle is used as a raw material. The source of the zinc oxide particle is not particularly limited provided that it may converted to zinc oxide by calcinating; for example, zinc oxide, zinc nitrate, zinc sulfate, zinc carbonate, zinc hydroxide, zinc acetate, and so on. As the source of the zinc oxide particle, zinc oxide is especially preferred. The source of the zinc oxide particle has preferably a median size (D50) of 0.01 to 1.0 μm. The median size (D50) of the source of the zinc oxide particle is a value measured by laser diffraction/scattering particle size distribution analyzer LA-750 (manufactured by HORIBA, Ltd.) or dynamic light, scattering particle size distribution analyzer ELS-Z2 (manufactured by OTSUKA ELECTRONICS, Ltd.).

The zinc oxide which is used as a raw material is not particularly limited, but the zinc oxide produced in French Method, American Method and other common methods can be used. Particularly, zinc oxide which is produced in French Method is preferably used because the zinc oxide has few impurities.

The metal compound includes, for example, nitrate salts, sulfate salts, organic acid salts such as acetate salts, citric salts, propionate salts, butyrate salts, lactate salts, oxalate salts, and stearate salts, hydroxides, and so on of each metal M. Among them, acetates are preferred because the insulation property can be provided effectively. The metal compounds may be used singly or two or more of them may be used in combination.

The addition amount of the metal compound in the production process is reflected in the value of $ny/2$ in the chemical formula (1), so the addition amount is preferably determined according to the purposed value of $ny/2$.

The granulation in the step (1) is not particularly limited about the method thereof, but it can be conducted by a method comprising dispersing the source of the zinc oxide particle and the metal compound into water to prepare a slurry and spray drying and other methods. In addition, there is a method comprising adding an aqueous solution of the metal compound to the source of the zinc oxide particle and mixing them with spartan granulator, spartan mixer, henschel mixer, or marumerizer to granulate and other methods.

When a slurry is prepared in the step (1), a sintering accelerator may be used in addition to the compound of the metal M. For example, an acetic acid may be mentioned as the sintering accelerator. Zinc oxide particles which sintered more densely than when only the compound of the metal M is added can be obtained in the step (2) by adding an acetic acid is added as a sintering accelerator.

In the step (1), if the case of using the slurry, a dispersant may be used. Compounds that can be used suitably as dispersant are not particularly limited but include ammonium polycarboxylate salt (POIZ532A manufactured by KAO Corporation, Ltd.).

It is preferred to use a fatty acid salt as the organic acid salt because the organic acid salt itself has a dispersant function so the slurry can be obtained easily.

A method for preparing the slurry is not particularly limited but includes, for example, a method comprising adding the above-mentioned components to water and dispersing at 18 to 30° C. for 10 to 30 minutes to obtain homogeneous slurry having the source of the zinc oxide particle content of 100 to 1500 g/l.

The method of spray drying is not particularly limited but includes, for example, a method comprising spraying the slurry into flowing air at about 150 to 300° C. by two-fluid nozzle or rotary disc to produce granulated particles having particle diameter of about 20 to 100 μm. On this occasion, it is preferred to adjust the slurry concentration within the range of 50 to 3500 cps of the viscosity of the slurry. The viscosity of the slurry is measured by using B-type viscometer (manufactured by TOKYO KEIKI, Ltd.) with 60 rpm share. In this flowing air, the granulated particles being dried are trapped by a filter with submicron order (bag filter). If the slurry viscosity, drying temperature, and flowing speed are without the desired range, the granulated particles becomes hollow or takes depressed shape.

The filler particle (A) can be obtained by calcinating the particles thus obtained. The calcinating conditions are not particularly limited but it is preferred to conduct the calcinating under the condition that the calcinating temperature is 700 to 1500° C., the calcinating time is 1 to 3 hours and the calcinating is static calcinating. The static calcinating can be conducted in a pot made of mullite or mullite/cordierite. The calcinating is more preferably conducted at 1000 to 1200° C. By calcinating in the above-mentioned method, filler particles showing few particle fusion and being sintered densely into the particle inside can be obtained.

The calcinating at less than 700° C. is not preferred because the particle may not be sintered sufficiently into the particle inside. If exceeding 1500° C., it is not preferred because the particle fusion proceeds.

The filler particle (A) thus obtained has preferably a median size (D50) of 17 to 10000 μm. The lower limit of the median size is preferably 20 μm. The upper limit of the median size is more preferably 1000 μm and still more preferably 100 μm. The particle diameter of filler particle is preferably larger because it can be expected that heat transfer route in the resin composition is increased as the particle diameter grow larger and improvement in heat transfer derived from closest-packing effect is attained by combination other filler. The filler particle has better property when used as the heat releasing filler, because the median size (D50) thereof is within the defined range.

In the specification, the median size (D50) is measured by laser diffraction/scattering particle size distribution analyzer LA-750 (manufactured by HORIBA, Ltd.), or by statistical means with the eye. The visual observation can be done by scanning electron microscope JSM-5400 (manufactured by JEOL, Ltd.) or JSM-7000F (manufactured by JEOL, Ltd.).

(Filler Particle (B))

The filler particle (B) is a zinc oxide particle having a median size (D50) of 1 to 20 μm and D90/D10 of 4 or less. That is, the filler particle is one having larger particle diameter and showing smaller value of D90/D10 than conventional zinc oxide particles (that is, coarse particles having extremely-large particle diameter are small in amount). This filler particle can obtain superior heat releasing property even though it is of a large particle, because the mixing of coarse particles having particle diameter of 50 μm or more has almost never happened and the particle size distribution thereof is sharp. The particle size distribution of the filler particle (B) is a value measured by using laser diffraction/scattering particle size distribution analyzer LA-750 (manufactured by HORIBA, Ltd.).

The lower limit of the median size (D50) is 1.0 μm and more preferably 1.5 μm. The upper limit of the median size (D50) is 20 μm and more preferably 17 μm.

In the filler particle (B), the proportion of coarse particles having particle diameter of 50 μm or more is preferably not more than 0.05 weight %. The proportion of coarse particles having particle diameter of 50 μm or more can be measured according to JIS K1410 zinc oxide/sieved residue test.

The filler particle (B) can be produced, for example, by calcinating a source of the zinc oxide particle in the presence of a halide such as ammonium bromide and ammonium chloride, and a metal compound containing at least one metal element selected from the group consisting of Mg, Co, Li, K, Na, and Cu. The method for producing the filler particle (B) is described in more detail below.

In the method for producing the filler particle (B), a source of the zinc oxide particle was used as a raw material. The source of the zinc oxide particle is not particularly limited if it is converted to zinc oxide by calcinating and there may be mentioned zinc oxide, zinc chloride, zinc sulfate, zinc carbonate, zinc acetate and the like. Particularly, the source of the zinc oxide particle is preferably zinc oxide. The source of the zinc oxide particle preferably has a median size (D50) of 0.01 to 1.0 μm. The median size (D50) of the source of the zinc oxide particle is a value measured by laser diffraction/scattering particle size distribution analyzer LA-750 (manufactured by HORIBA, Ltd.) or dynamic light scattering particle size distribution analyser ELS-Z2 (manufactured by OTSUKA ELECTRONICS, Ltd.).

The zinc oxide which is used as a raw material is not particularly limited, but the zinc oxide produced in French Method, American Method and other common methods can be used. Particularly, zinc oxide which is produced in French Method is preferably used because the zinc oxide has few impurities.

The method for producing the filler particle (B) is characterized by calcinating in the presence of a halide such as ammonium bromide and ammonium chloride, and a metal compound containing at least one metal element selected from the group consisting of Mg, Co, Li, K, Na, and Cu. The metal compound is not particularly limited but includes compounds mentioned in the method for producing the filler particle (A), and metal compounds containing a halogen such as chlorides, bromides, and so on. Among them, bromides such as magnesium bromide are preferred. In the production of inorganic particles, the calcinating in the presence of flux may be performed to increase particle diameter thereof. When bromides of the metal M is used as flux in this calcinating, the particle size distribution of the obtained filler particle (B) became sharper than when other compounds were used as flux.

When the metal compounds containing a halogen such as chlorides, bromides, and so on are used as the metal compound, a halide such as ammonium bromide and ammonium chloride is not necessarily used, but a halide such as ammonium bromide and ammonium chloride may be used as the sintering accelerator.

The filler particle (B) can be produced by mixing the source of the zinc oxide particle, a halide such as ammonium bromide and ammonium chloride, and the metal compound according to the common manner and calcinating the obtained mixture. The calcinating is preferably, for example, a static calcinating with use of a tunnel kiln or shuttle kiln, from an industrial viewpoint. By static calcinating, particles fuse with each other and particles growth proceeds effectively, and thus zinc oxide particles having large particle diameter can be obtained effectively.

The calcinating is performed at 600 to 1200° C. When the temperature is less than 600° C., it is not preferred because particle diameter may not increase sufficiently. When the temperature exceeds 1200° C., it is not preferred because many coarse particles occur and yield may be decreased.

The filler particles (B) obtained by the above method have a sharp particle size distribution, but the zinc oxide particles may be pulverized or classified using a sieve if sharper particle size distribution is required or in order to remove a few coarse particles. The method of pulverizing is not particularly limited but includes the method using an atomizer for example. The classification using a sieve is not particularly restricted but includes wet classification and dry classification.

The use of the filler particle of the present disclosure is not particularly limited but the particles can be used as a heat releasing filler, suitably. That is, zinc oxide particle can be used suitably as the heat releasing filler because of the high heat conductive property. In the filler particle of the present disclosure, the conductive property is suppressed while keeping this heat releasing property, so the filler particle can be used suitably as the heat releasing filler which used in the purposes such as electronic devices.

When the filler particle of the present disclosure is used as the heat releasing filler, the density is preferably 4.0 g/cm$^3$ or more and more preferably 4.5 g/cm$^3$ or more. The high-density filler particle defined by the above-mentioned range easily produces heat conduction and has superior property as the heat releasing filler because the particle is dense particle with a few hollow portions. If the density is less than 4.0 g/cm$^3$, sufficient heat releasing property may not be obtained.

When used as the heat releasing filler, the filler particle of the present disclosure is preferably spherical. Spherical particles can be closest-packed, so the proportion of the heat releasing filler can be increased. Preferably, this results in higher heat releasing property. The shape of the particle can be observed by scanning electron microscope JSM-5400 (manufactured by JEOL, Ltd.) or JSM-7000 F (manufactured by JEOL, Ltd.). The zinc oxide particle preferably has an aspect ratio of 1.0 to 1.5. When the particle is used as a heat releasing filler, as the aspect ratio comes close to 1.0, the orientation of the fillers gets less. Therefore, a resin molded article in which fillers are filled uniformly can be obtained by pressure molding from all angles. The upper limit of the aspect ratio is more preferably 1.10.

The filler particle of the present disclosure preferably have apparent density of 2.50 g/ml or more measured by JIS K 5101-12-1 test methods for pigment-apparent density or apparent specific volume (static method). Such apparent density is an indicative value of densification, high density, and regulation and uniformity in shape of the particle. Such filler particle having high apparent density has the advantage that the particle shows superior heat releasing property due to high density of the particle itself and that the filling rate to a resin can be increased.

The filler particle of the present disclosure preferably have tap bulk density of 3.10 g/cm$^3$ or more measured according to JIS R 1639-2. Such filler particle showing high tap bulk density has the advantage that the particle has superior heat releasing property due to high density of the particle itself and that the filling rate to a resin can be increased.

In the filler particles of the present disclosure, 90% or more of the particles preferably have the aspect ratio of 1.10 of less. That is, the filling rate when used as filler is easily decreased if particles having high aspect ratio and low sphericity are mixed. Therefore, it is preferred that particles having true spherical shape are mixed at high rate. In addition, if 90% or more particles have the aspect ratio of 1.10 or less when the aspect ratio of ail particles existing in the field of vision in an electron microscope photograph were measured and the aspect ratio of 250 particles in all were measured by the above-mentioned operation, we judged that 90% or more of the particles nave aspect ratio of 1.10 or less.

The filler particle of the present disclosure can be used as the filler component in a resin composition, grease, and a coating composition.

When filler particle is used as the filler in a resin composition, the resin to be used may be a thermoplastic resin or a thermosetting resin and includes epoxy resins, phenol resins, polyphenylene sulfide resins (PPS), polyester resins, polyamides, polyimides, polystyrenes, polyethylenes, polypropylenes, polyvinyl chloride, polyvinylidene chloride, fluorine resins, polymethyl methacrylate, ethylene/ethyl acrylate copolymer resin (EEA), polycarbonates, polyurethanes, polyacetals, polyphenylene ethers, polyetherimides, acrylonitrile-butadiene-styrene copolymer resin (ABS), epoxides, phenols, liquid crystal resins (LCP), silicone resins, acrylic resins and other resins.

The resin composition of the present disclosure may be (1) a resin composition for thermal molding obtained by kneading a thermoplastic resin and the filler particle in melting condition, (2) a resin composition obtained by kneading a thermosetting resin and the filler particle followed by thermosetting, (3) a resin composition for paint obtained by dispersing the filler particle in a resin solution or dispersion liquid, or other resin composition.

The addition amount of the filler particle in the resin composition of the present disclosure can be arbitrarily determined according to the performance of the resin composition such as heat releasing property, hardness and so on. In order to express the heat releasing property of the filler particle sufficiently, the addition amount of the filler particle is preferably 60 volume % or more, more preferably 68 volume % or more relative to the total solid matter of the resin composition.

When the resin composition of the present disclosure is a resin composition for thermal molding, the resin component may be selected in accordance to the use. For example, when the resin composition is placed between the heat source and the heat releasing plate to make them stick together, resins having high adhesion property and low hardness such as silicone resins and acrylic resins can be selected.

When the resin composition of the present disclosure is a resin composition for paint, the resin may be a hardenable one or a nonhardenable one. The coating composition may be a solvent type one containing organic solvents or an aqueous type one containing a resin dissolved or dispersed in water.

The filler particle can be used as a filler particle in grease obtained by mixing the filler particle with a base oil which contains a mineral oil or a synthetic oil. When the filler particle is used in this grease, as the synthetic oil, α-olefins, diesters, polyol esters, trimellitic esters, polyphenyl ethers, alkylphenyl ethers and so on can be used. In addition, the particles can be used as a heat releasing grease obtained by mixing with silicone oils.

When the filler particle of the present disclosure is used as a heat releasing filler, the particle may be used in combination with other components. The other components which may be used together, include other heat releasing fillers than zinc oxide such as metal oxides including magnesium oxide, titanium oxide and aluminum oxide, aluminum nitride, boron nitride, silicon carbide, silicon nitride, titanium nitride, metallic silicon, and diamond, resins and surfactants.

The filler particle of the present disclosure can be used suitably as the heat releasing filler used in the electronic device fields because of superior insulation property. Also, the filler particle can be used in the fields such as pigments for a paint/ink.

EXAMPLES

Hereinafter, the present disclosure will be described in more detail by way of examples, but the present disclosure is not limited to these examples.

Examples 1

Figure 1:
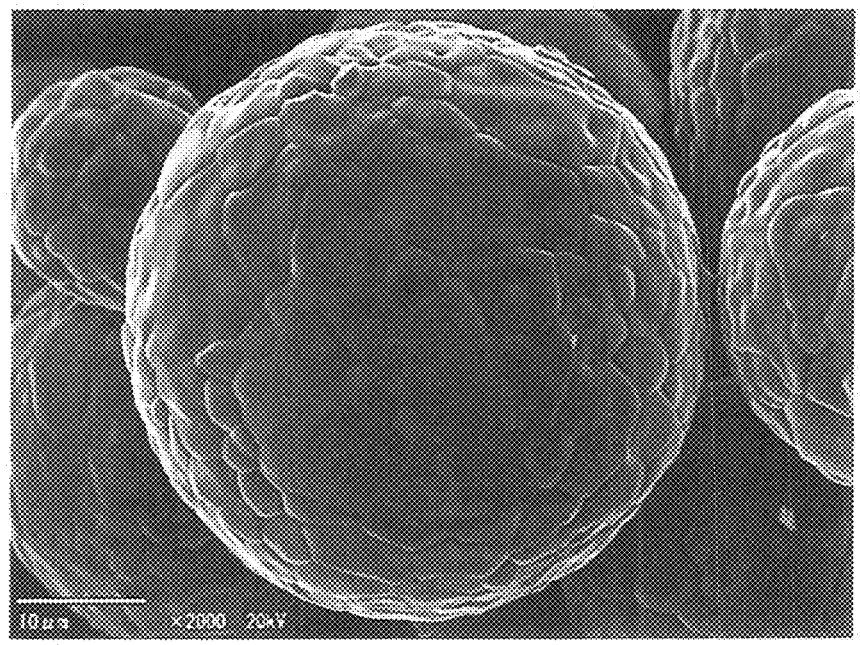
FIG. 1 is a scanning electron microscope photograph of filler particles of the present disclosure obtained in example 1.
Figure 2:
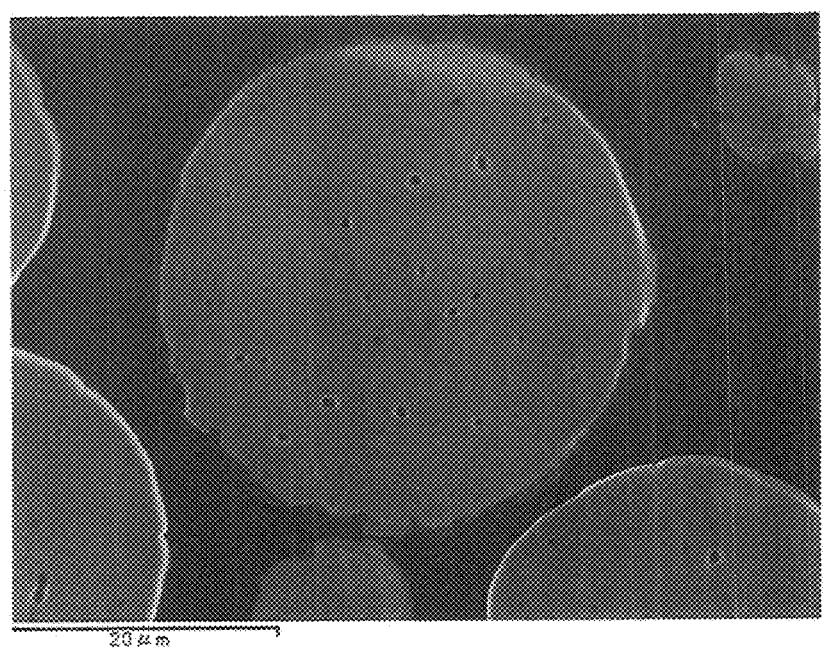
FIG. 2 is a scanning electron microscope photograph of the section of filler particles of the present disclosure obtained in example 1.

ZINC OXIDE SUPERFINE (manufactured by Sakai Chemical Industry, Ltd., median size (D50) 0.2 μm) 600 g was re-pulped into water, dispersant (manufactured by KAO, Ltd., POIZ532A) 21.0 g (3.50 weight % relative to the weight of the ZINC OXIDE SUPERFINE) were added to the aqueous solution, and magnesium acetate tetrahydrate being a compound of the metal M 161.4 g (26.9 weight % relative to the weight of the ZINC OXIDE SUPERFINE) was added to prepare a slurry with concentration of 590 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1200° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being sintered densely into the particle inside, being spherical and having a median size (D50) of 29.0 μm. The size and shape of the obtained zinc oxide particle were observed by scanning Electron Microscope JSM-5400 (manufactured by JEOL, Ltd.). The obtained electron microscope photograph was shown in FIG. 1.

Examples 2

Figure 8:
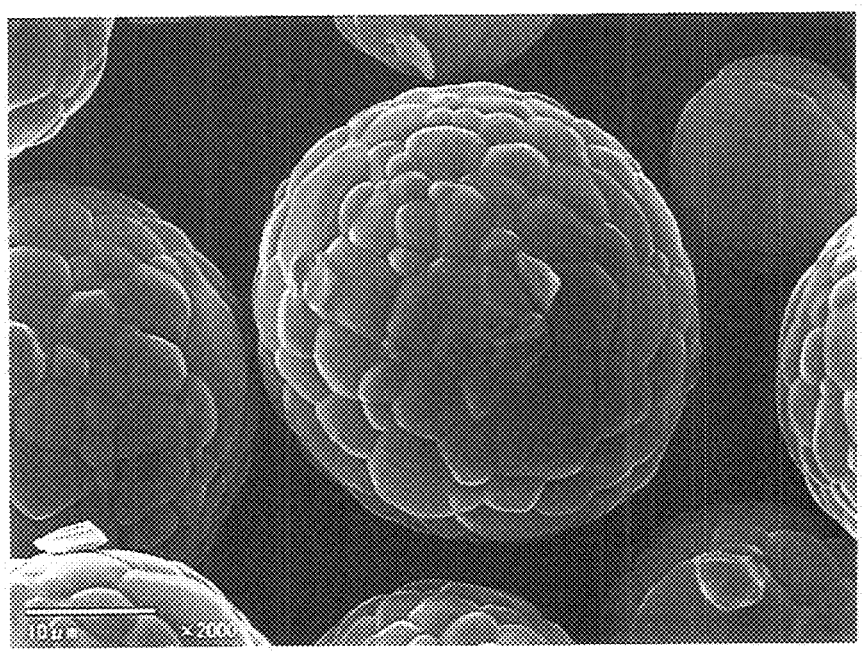
FIG. 8 is a scanning electron microscope photograph of filler particles of the present disclosure obtained in example 2.
Figure 9:
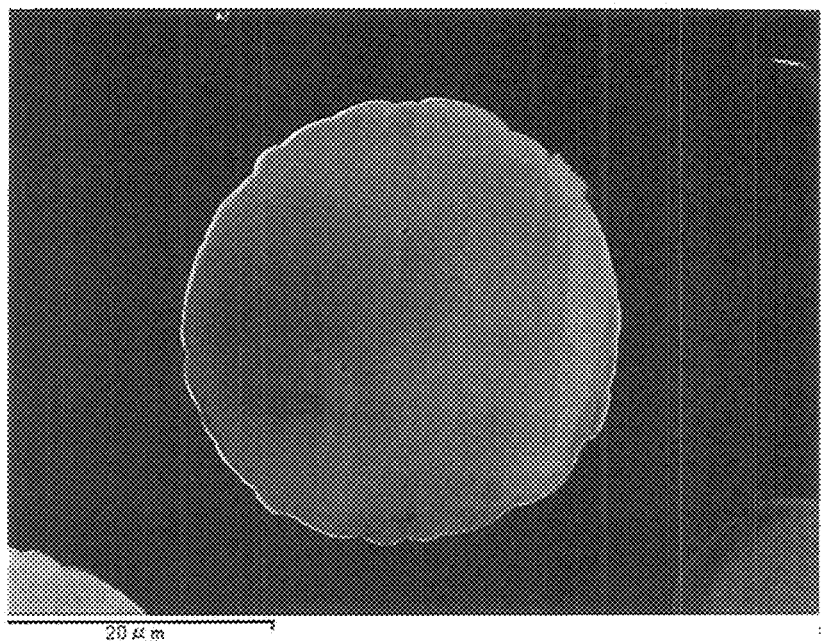
FIG. 9 is a scanning electron microscope photograph of the section of filler particles of the present disclosure obtained in example 2.
Figure 10:
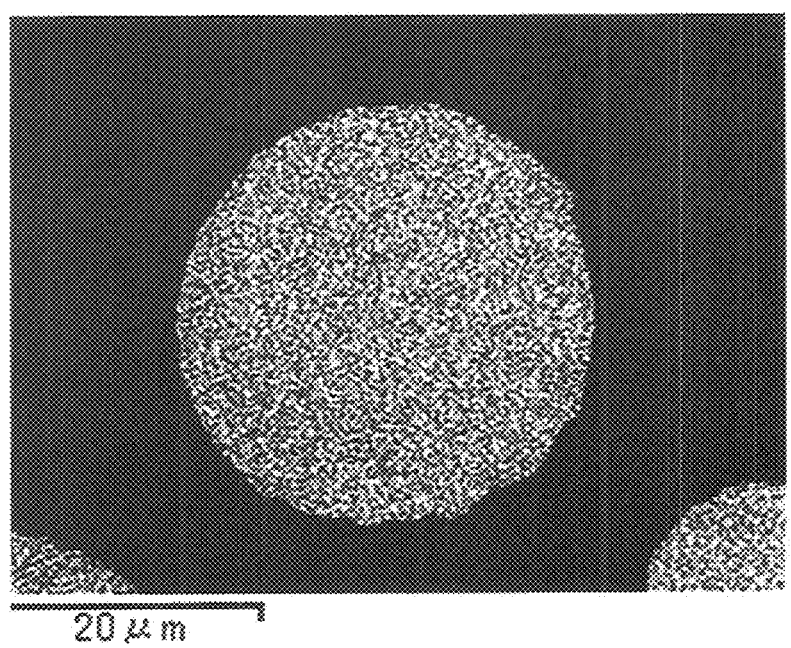
FIG. 10 is an image showing Zn mapping obtained by wavelength dispersive X-ray analysis at the section of filler particles of the present disclosure obtained in example 2.
Figure 11:
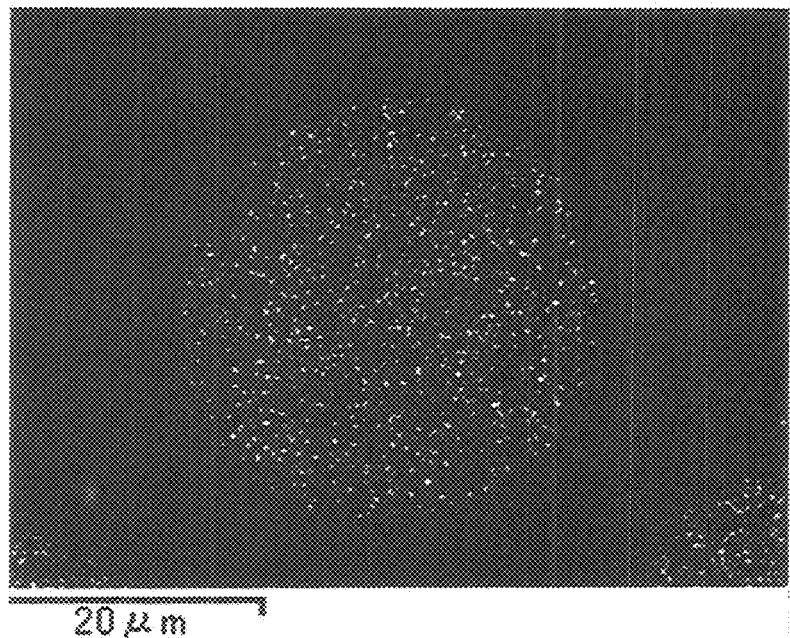
FIG. 11 is an image showing Co mapping obtained by wavelength dispersive X-ray analysis at the section of filler particles of the present disclosure obtained in example 2.
Figure 12:
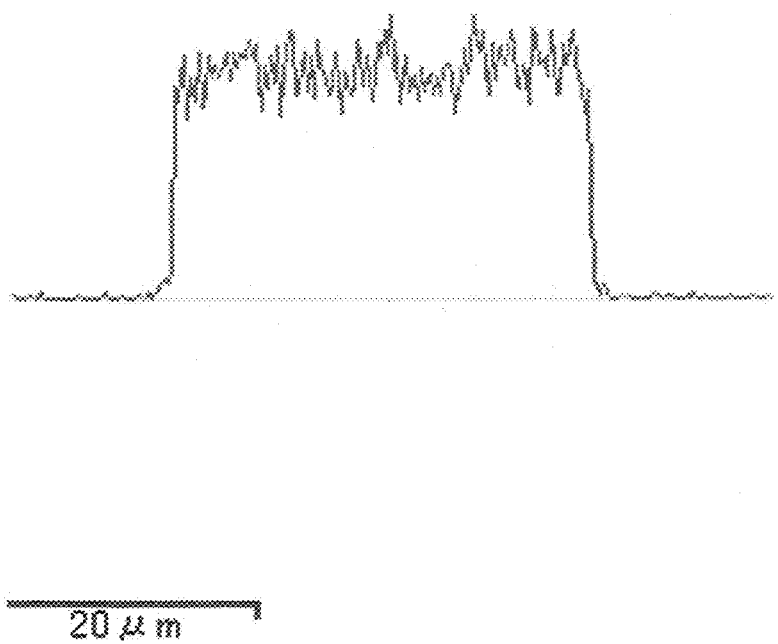
FIG. 12 is an image showing the line strength of Zn at the section of filler particles of the present disclosure obtained in example 2 determined by wavelength dispersive X-ray analysis.
Figure 13:
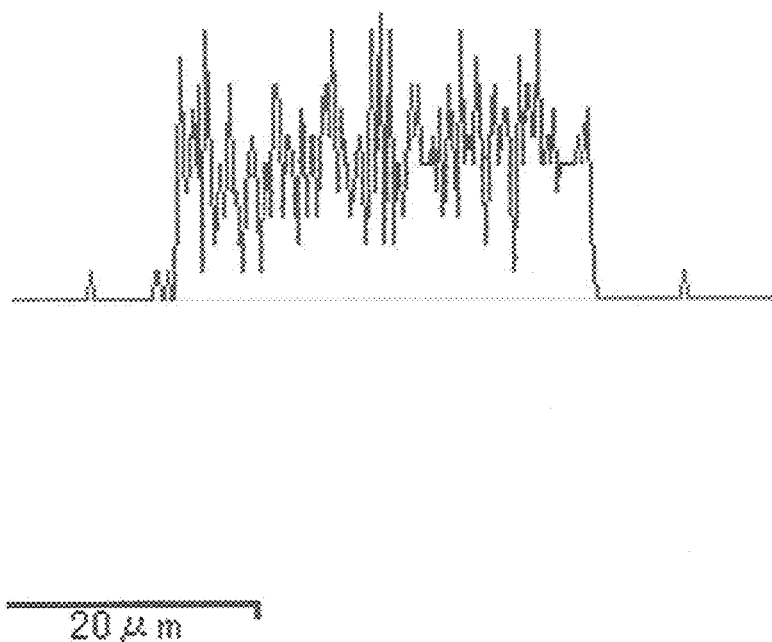
FIG. 13 is an image showing the line strength of Co at the section of filler particles of the present disclosure obtained in example 2 determined by wavelength dispersive X-ray analysis.

ZINC OXIDE SUPERFINE (manufactured by Sakai Chemical Industry, Ltd., median size (D50) 0.2 μm) 600 g was re-pulped into water, cobalt acetate tetrahydrate being a compound of the metal M 61.8 g (10.3 weight % relative to the weight of the ZINC OXIDE SUPERFINE) was added to the aqueous solution, and acetic acid being the sintering accelerator 3.66 g (0.61 weight % relative to the weight of the ZINC OXIDE SUPERFINE) was added to prepare a slurry with concentration of 340 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1200° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being sintered densely into the particle inside, being spherical and having a median size (D50) of 31.7 μm. The size and shape of the obtained zinc oxide particle were observed by Scanning Electron Microscope JSM-5400 (manufactured by JEOL, Ltd.). The obtained electron microscope photograph was shown in FIG. 8.

Examples 3

Figure 15:
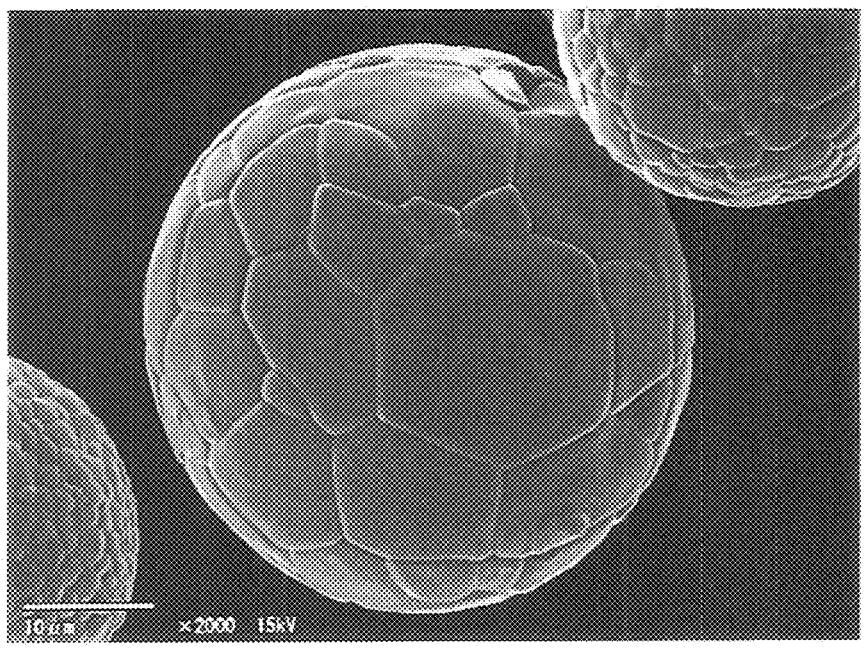
FIG. 15 is a scanning electron microscope photograph of filler particles of the present disclosure obtained in example 3.

ZINC OXIDE SUPERFINE (manufactured by Sakai Chemical Industry, Ltd., median sire (D50) 0.2 μm) 600 g was re-pulped into water, dispersant (manufactured by KAO, Ltd., POIZ532A) 21.0 g (3.50 weight % relative to the weight of the ZINC OXIDE SUPERFINE) were added to the aqueous solution, and lithium acetate being a compound of the metal M 3.0 g (0.5 weight % relative to the weight of the ZINC OXIDE SUPERFINE) and acetic acid being the sintering accelerator 3.66 g (0.61 weight % relative to the weight of the ZINC OXIDE SUPERFINE) were added to prepare a slurry with concentration of 500 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1000° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being sintered densely into the particle inside, being spherical and having a median size (D50) of 31.9 μm. The size and shape of the obtained zinc oxide particle were observed by Scanning Electron Microscope JSM-5400 (manufactured by JEOL, Ltd.). The obtained electron microscope photograph was shown in FIG. 15.

Examples 4

Figure 16:
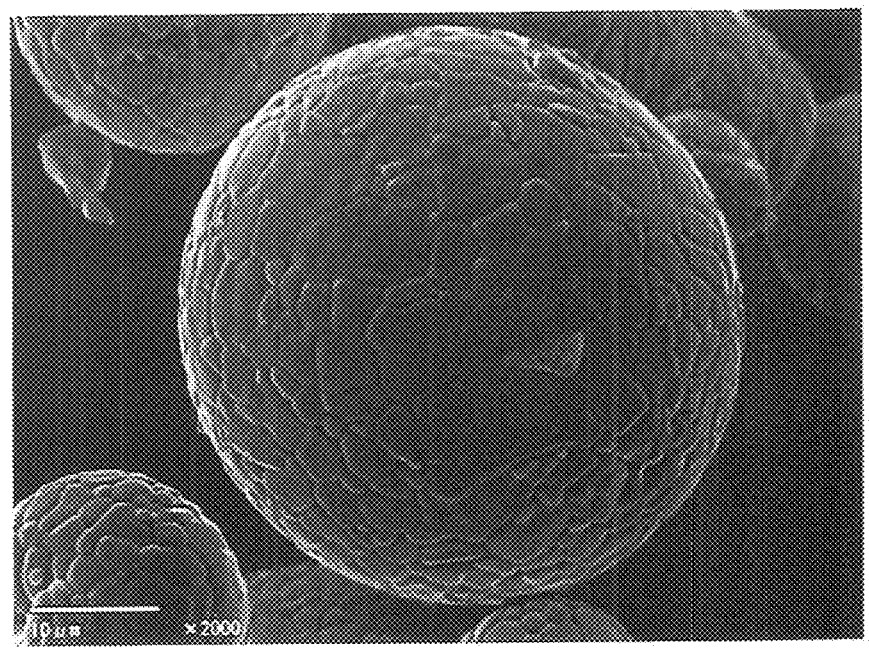
FIG. 16 is a scanning electron microscope photograph of filler particles of the present disclosure obtained in example 4.

ZINC OXIDE SUPERFINE (manufactured by Sakai Chemical Industry, Ltd., median size (D50) 0.2 μm) 600 g was re-pulped into water, dispersant (manufactured by KAO, Ltd., POIZ532A) 21.0 g (3.50 weight % relative to the weight of the ZINC OXIDE SUPERFINE) were added to the aqueous solution, and potassium acetate being a compound of the metal M 6.0 g (1.0 weight % relative to the weight of the ZINC OXIDE SUPERFINE) was added to prepare a slurry with concentration of 1470 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1000° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being sintered densely into the particle inside, being spherical and having a median size (D50) of 34.4 μm. The size and shape of the obtained zinc oxide particle were observed by Scanning Electron Microscope JSM-5400 (manufactured by JEOL, Ltd.). The obtained electron microscope photograph was shown in FIG. 16.

Examples 5

Figure 17:
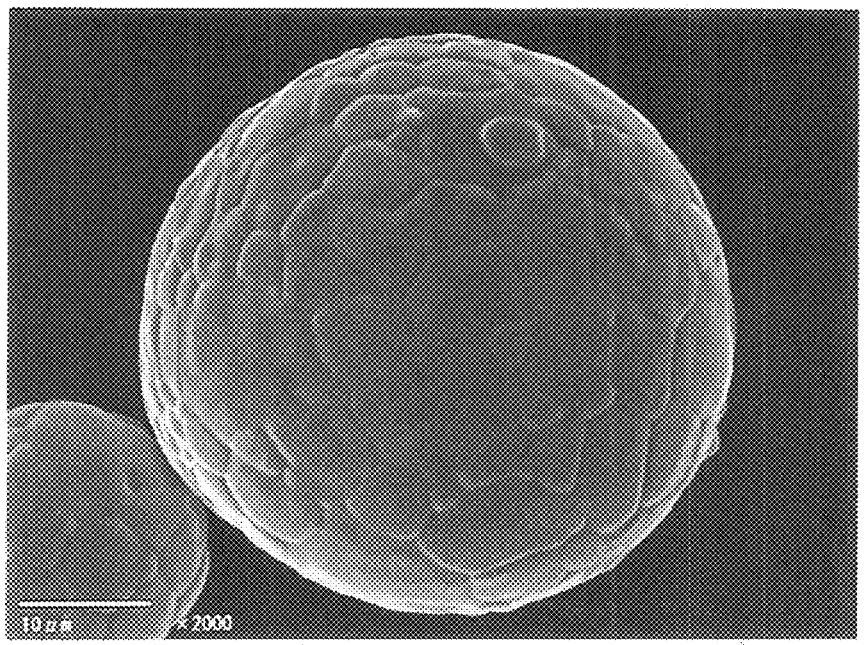
FIG. 17 is a scanning electron microscope photograph of filler particles of the present disclosure obtained in example 5.
Figure 18:
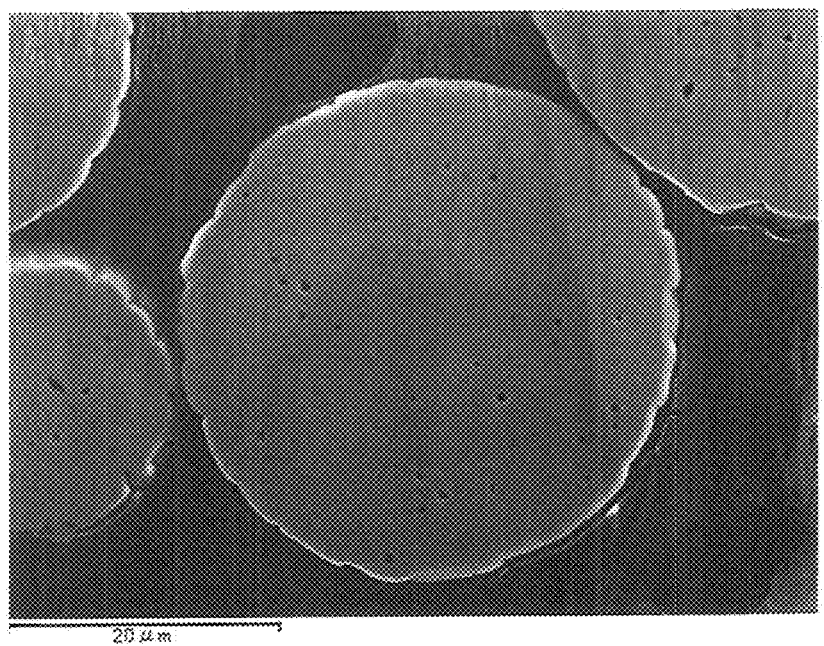
FIG. 18 is a scanning electron microscope photograph of the section of filler particles of the present disclosure obtained in example 5.
Figure 19:
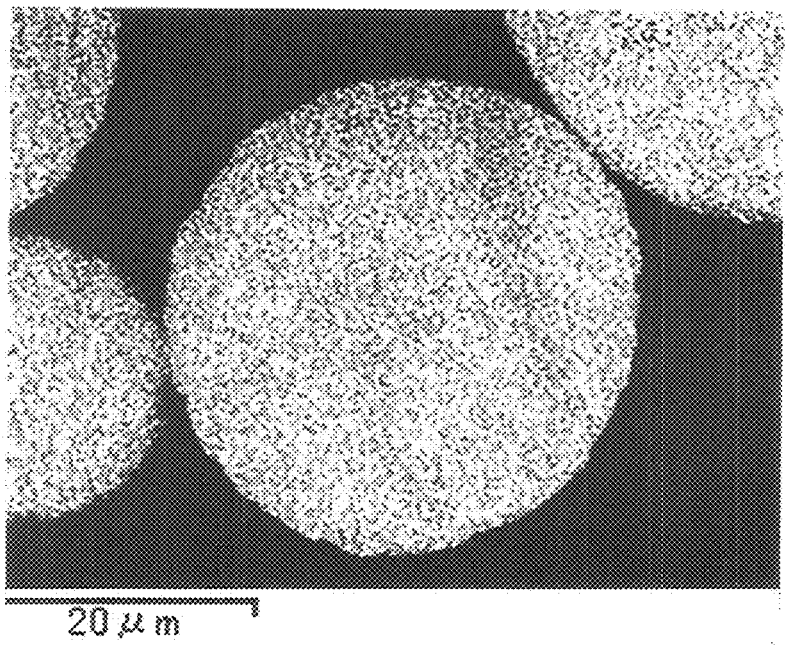
FIG. 19 is an image showing Zn mapping obtained by wavelength dispersive X-ray analysis at the section of filler particles of the present disclosure obtained in example 5.
Figure 20:
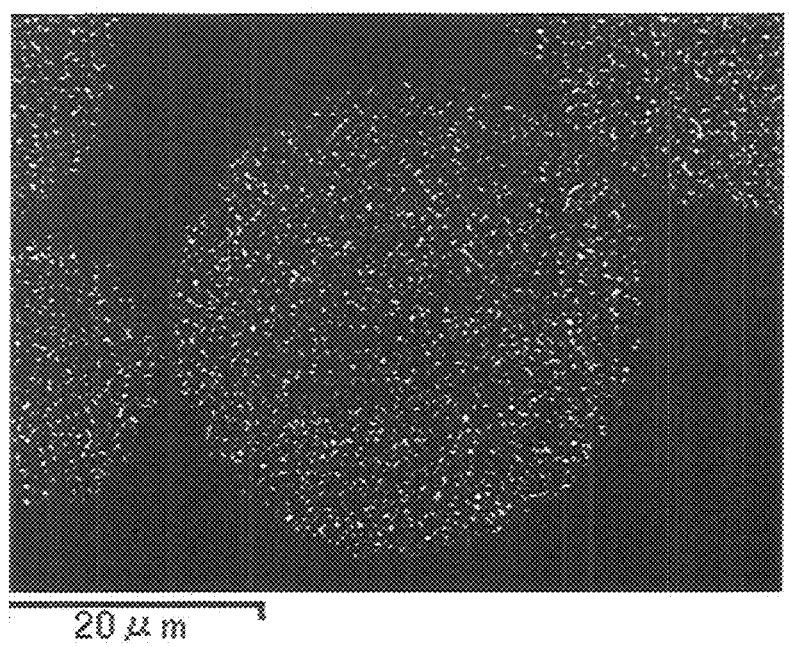
FIG. 20 is an image showing Na mapping obtained by wavelength dispersive X-ray analysis at the section of filler particles of the present disclosure obtained in example 5.
Figure 21:
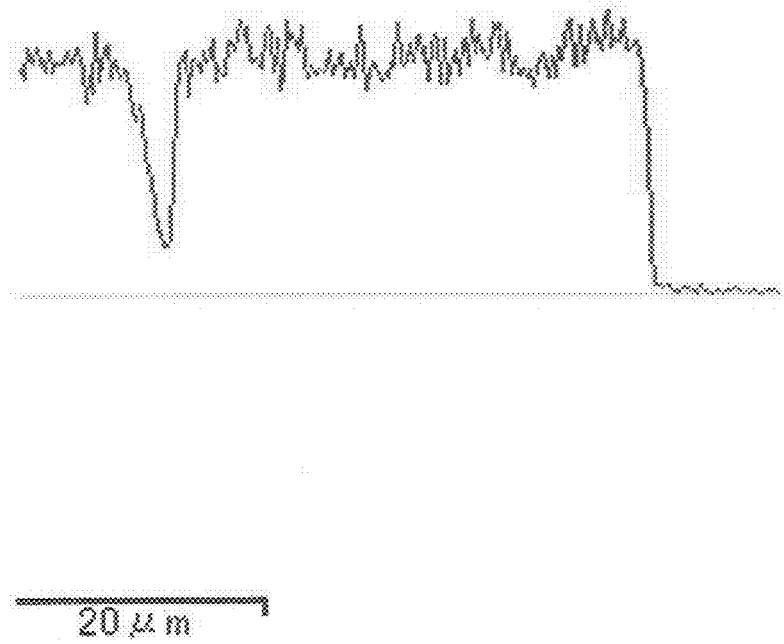
FIG. 21 is an image showing the line strength of Zn at the section of filler particles of the present disclosure obtained in example 5 determined by wavelength dispersive X-ray analysis.
Figure 22:
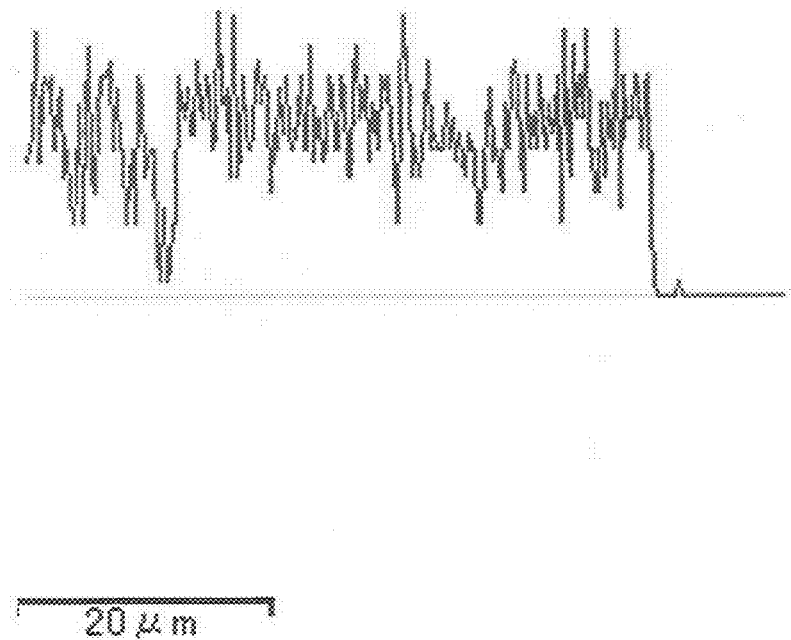
FIG. 22 is an image showing the line strength of Na at the section of filler particles of the present disclosure obtained in example 5 determined by wavelength dispersive X-ray analysis.

ZINC OXIDE SUPERFINE (manufactured by Sakai Chemical Industry, Ltd., median size (D50) 0.2 μm) 600 g was re-pulped into water, dispersant (manufactured by KAO, Ltd., POIZ532A) 21.0 g (3.50 weight % relative to the weight of the ZINC OXIDE SUPERFINE) were added to the aqueous solution, and sodium acetate being a compound of the metal M 20.3 g (3.38 weight % relative to the weight of the ZINC OXIDE SUPERFINE) was added to prepare a slurry with concentration of 690 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1100° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being calcinated densely into the particle inside, being spherical and having a median size (D50) of 33.4 μm. The size and shape of the obtained zinc oxide particle were observed by Scanning Electron Microscope JSM-5400 (manufactured by JEOL, Ltd.). The obtained electron microscope photograph was shown in FIG. 17.

Examples 6

Figure 23:
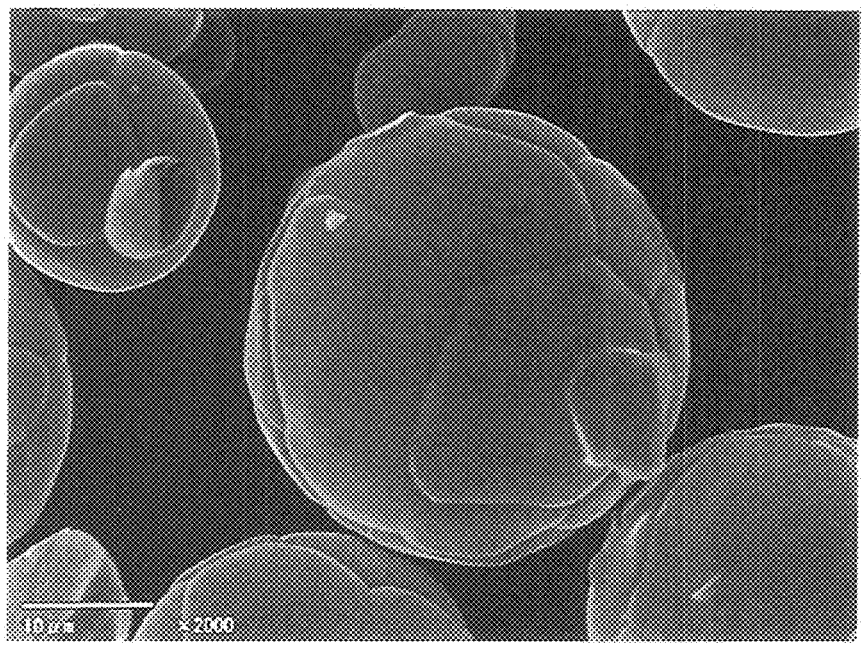
FIG. 23 is a scanning electron microscope photograph of filler particles of the present disclosure obtained in example 6.
Figure 24:
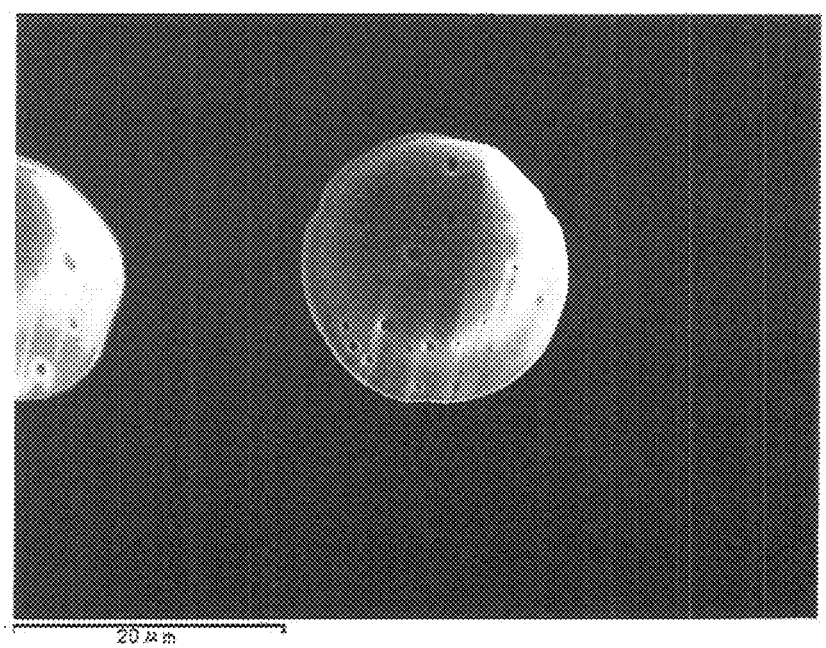
FIG. 24 is a scanning electron microscope photograph of the section of filler particles of the present disclosure obtained in example 6.
Figure 25:
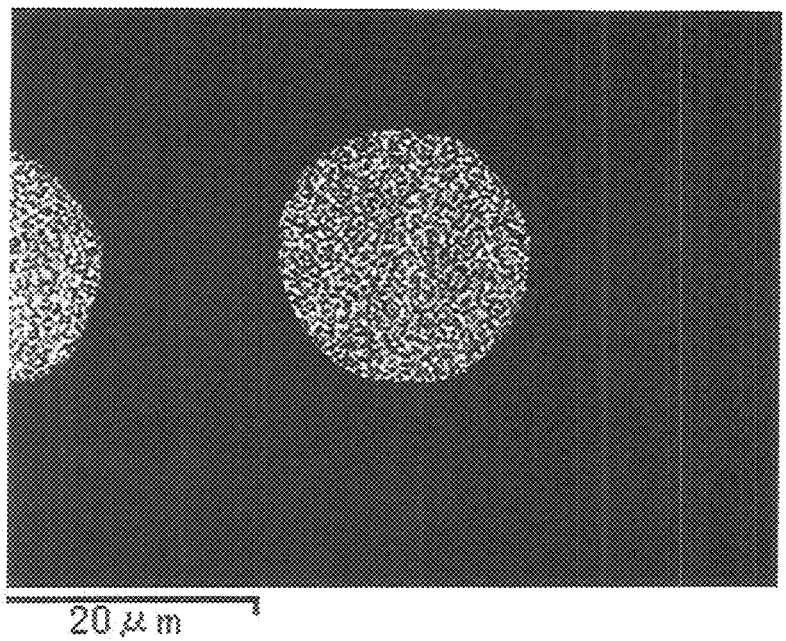
FIG. 25 is an image showing Zn mapping obtained by wavelength dispersive X-ray analysis at the section of filler particles of the present disclosure obtained in example 6.
Figure 26:
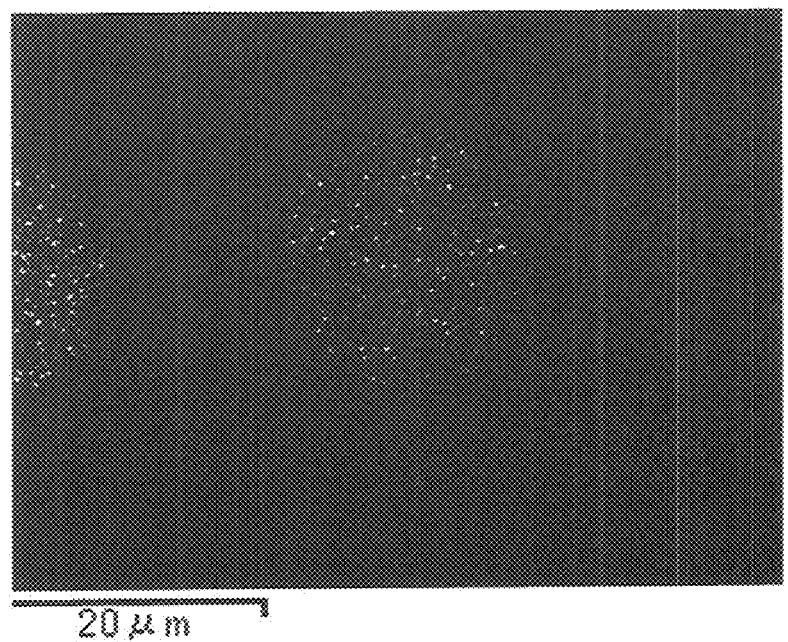
FIG. 26 is an image showing Cu mapping obtained by wavelength dispersive X-ray analysis at the section of filler particles of the present disclosure obtained in example 6.
Figure 27:
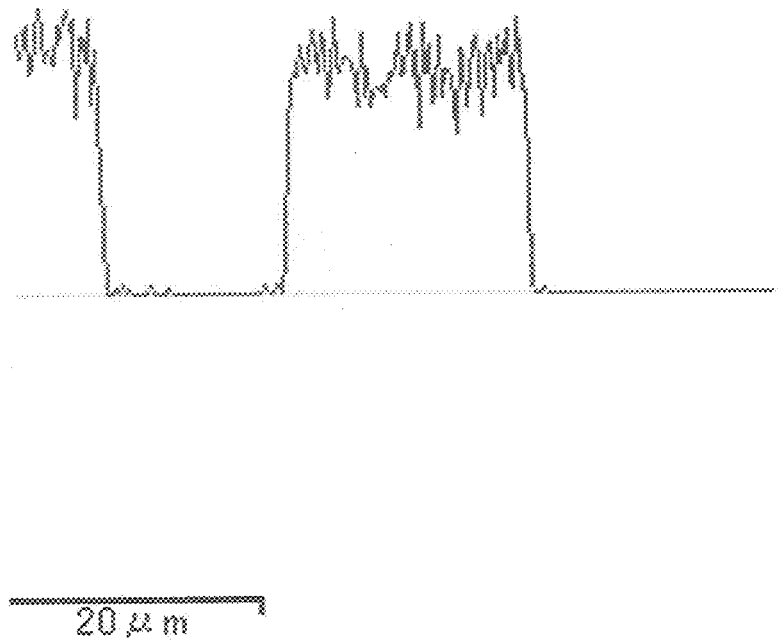
FIG. 27 is an image showing the line strength of Zn at the section of filler particles of the present disclosure obtained in example 6 determined by wavelength dispersive X-ray analysis.
Figure 28:
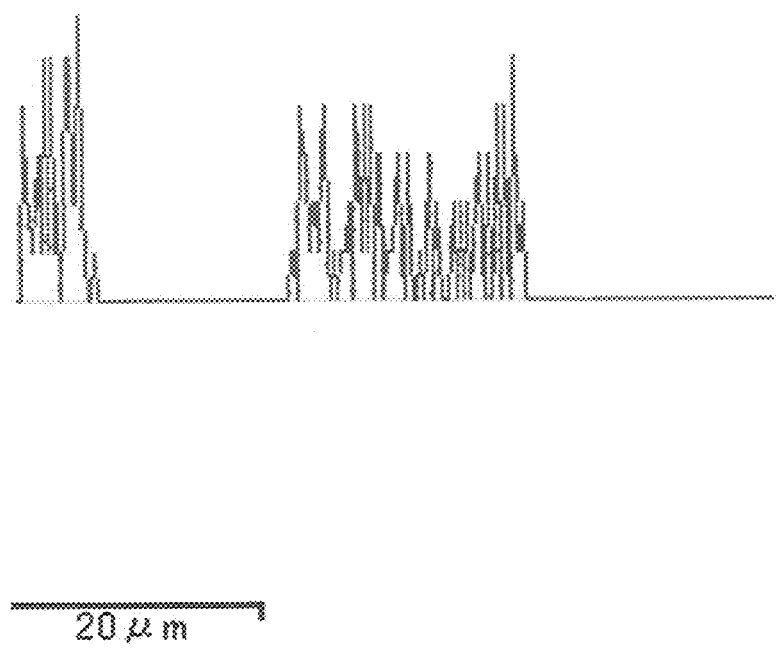
FIG. 28 is an image showing the line strength of Cu at the section of filler particles of the present disclosure obtained in example 6 determined by wavelength dispersive X-ray analysis.

ZINC OXIDE SUPERFINE (manufactured by Sakai Chemical Industry, Ltd., median size (D50) 0.2 μm) 600 g was re-pulped into water, dispersant (manufactured by KAO, Ltd., POIZ532A) 21.0 g (3.50 weight % relative to the weight of the ZINC OXIDE SUPERFINE) were added to the aqueous solution, and copper (I) acetate being a compound of the metal M 35.04 g (5.84 weight % relative to the weight of the ZINC OXIDE SUPERFINE) and acetic acid being the sintering accelerator 3.0 g (0.50 weight % relative to the weight of the ZINC OXIDE SUPERFINE) were added to prepare a slurry with concentration of 240 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1150° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being sintered densely into the particle inside, being spherical and having a median size (D50) of 28.7 μm. The size and shape of the obtained zinc oxide particle were observed by Scanning Electron Microscope JSM-5400 (manufactured by JEOL, Ltd.). The obtained electron microscope photograph was shown in FIG. 23.

Examples 7

Figure 29:
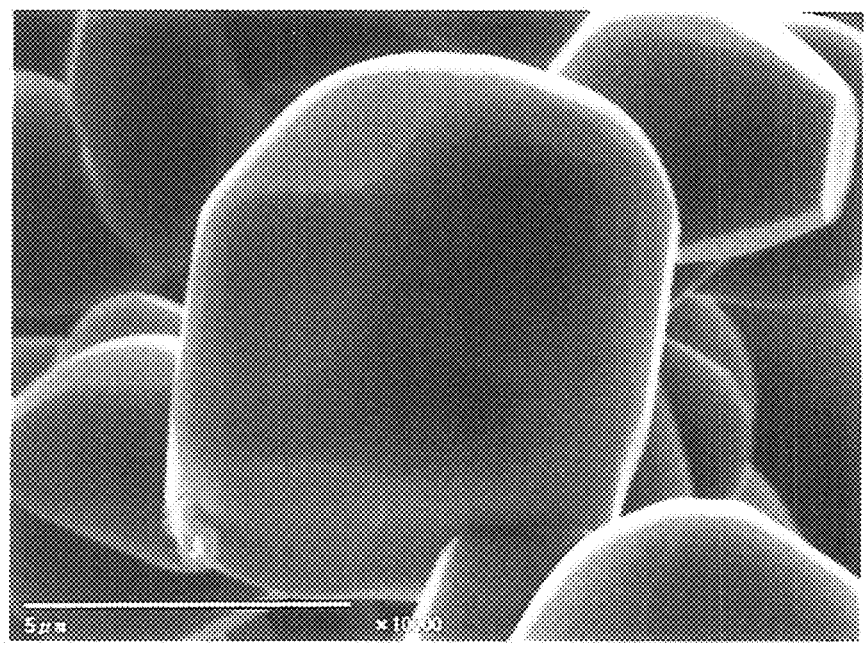
FIG. 29 is a scanning electron microscope photograph of filler particles of the present disclosure obtained in example 7.
Figure 30:
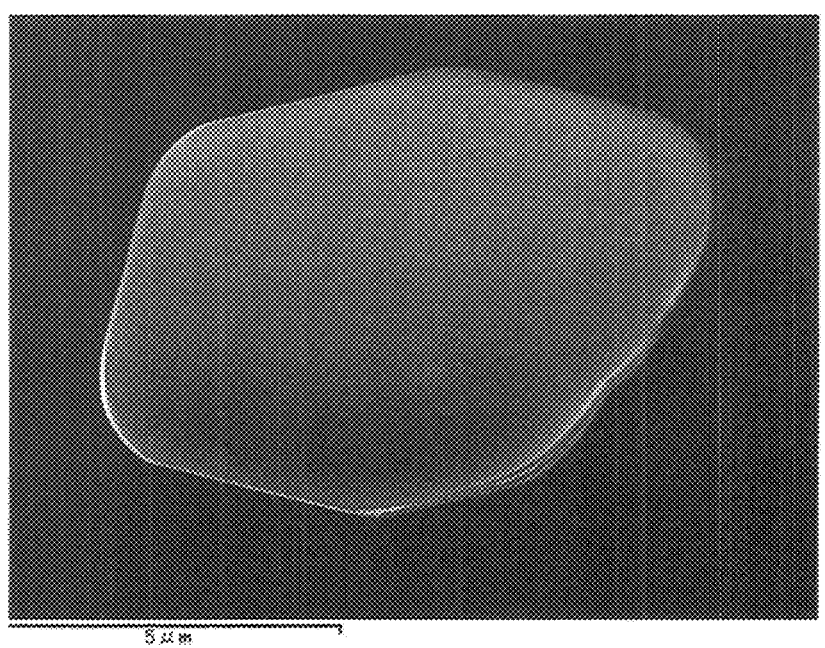
FIG. 30 is a scanning electron microscope photograph of the section of filler particles of the present disclosure obtained in example 7.
Figure 31:
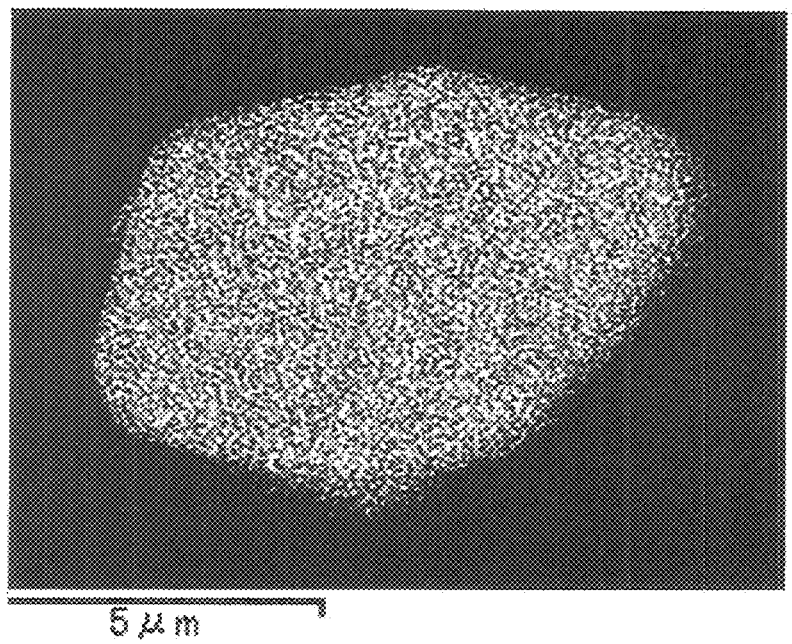
FIG. 31 is an image showing Zn mapping obtained by wavelength dispersive X-ray analysis at the section of filler particles of the present disclosure obtained in example 7.
Figure 32:
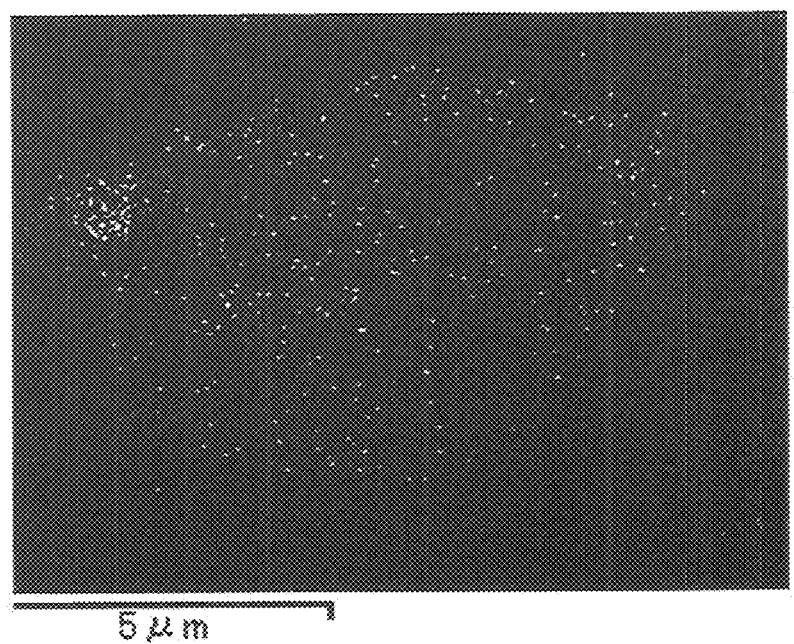
FIG. 32 is an image showing Mg mapping obtained by wavelength dispersive X-ray analysis at the section of filler particles of the present disclosure obtained in example 7.
Figure 33:
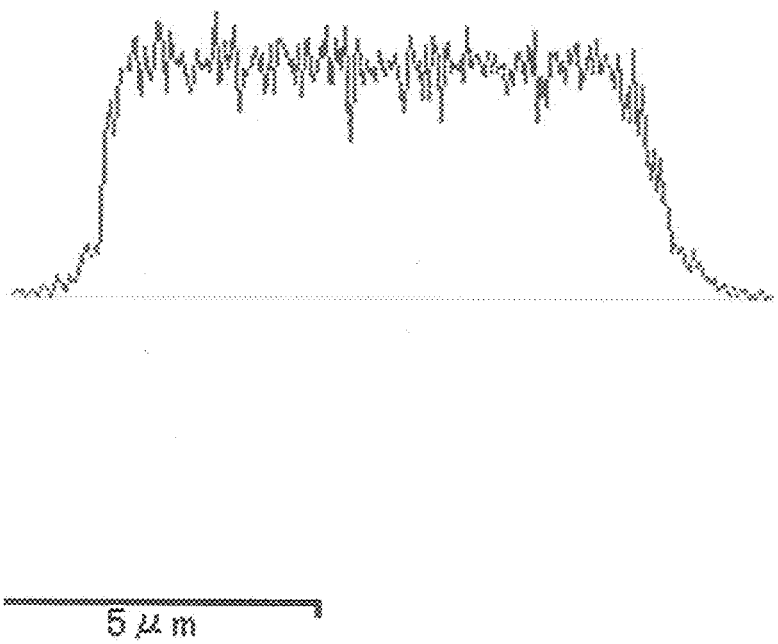
FIG. 33 is an image showing the line strength of Zn at the section of filler particles of the present disclosure obtained in example 7 determined by wavelength dispersive X-ray analysis.
Figure 34:
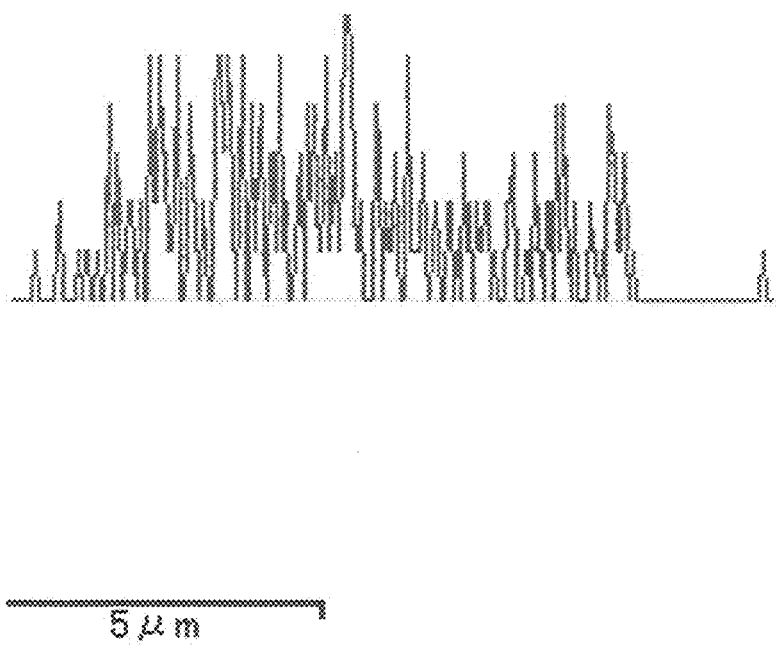
FIG. 34 is an image showing the line strength of Mg at the section of filler particles of the present disclosure obtained in example 7 determined by wavelength dispersive X-ray analysis.

ZINC OXIDE SUPERFINE (manufactured by Sakai Chemical Industry, Ltd., median size (D50) 0.2 μm) 600 g, magnesium chloride hexahydrate being a compound of the metal M 156 g (26.0 weight % relative to the weight of the ZINC OXIDE SUPERFINE), and ammonium bromide being the sintering accelerator 12 g (1.0 weight % relative to the weight of the ZINC OXIDE SUPERFINE) were added into a vinyl bag to dry blend for 30 seconds. The mixed powder was put in a pot made of mullite or mullite/cordierite and calcinated at 1000° C. for 3 hours. After cooling and dispersing into water 1.0 liter, this slurry was screened through a sieve of 200 mesh (opening of screen 75 μm). The slurry passing through the mesh was filtered and dried to obtain filler particles having a median size (D50) of 9.1 μm. The size and shape of the obtained zinc oxide particle were observed by Scanning Electron Microscope JSM-5400 (manufactured by JEOL, Ltd.). The obtained electron microscope photograph was shown in FIG. 29.

Examples 8

Figure 36:
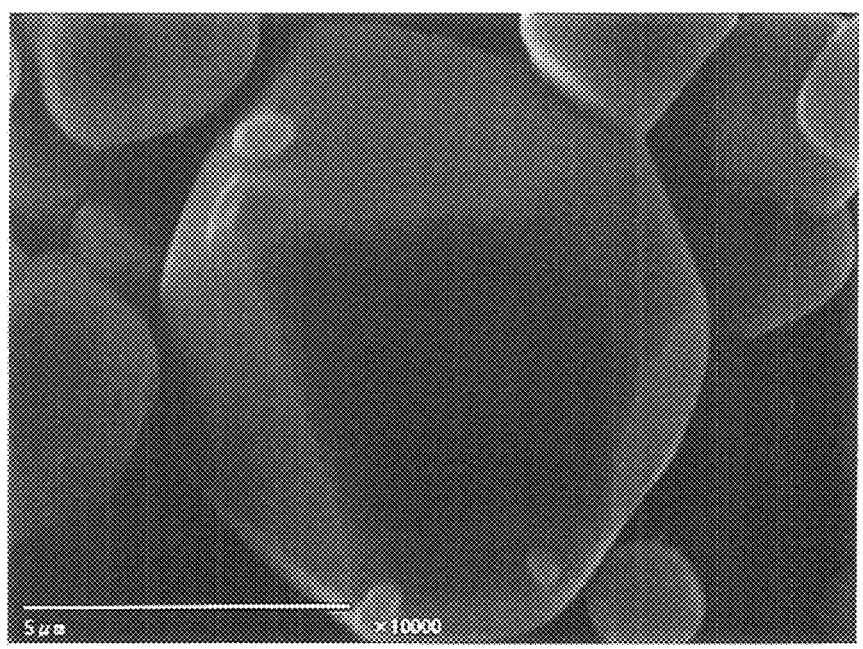
FIG. 36 is a scanning electron microscope photograph of filler particles of the present disclosure obtained in example 8.
Figure 37:
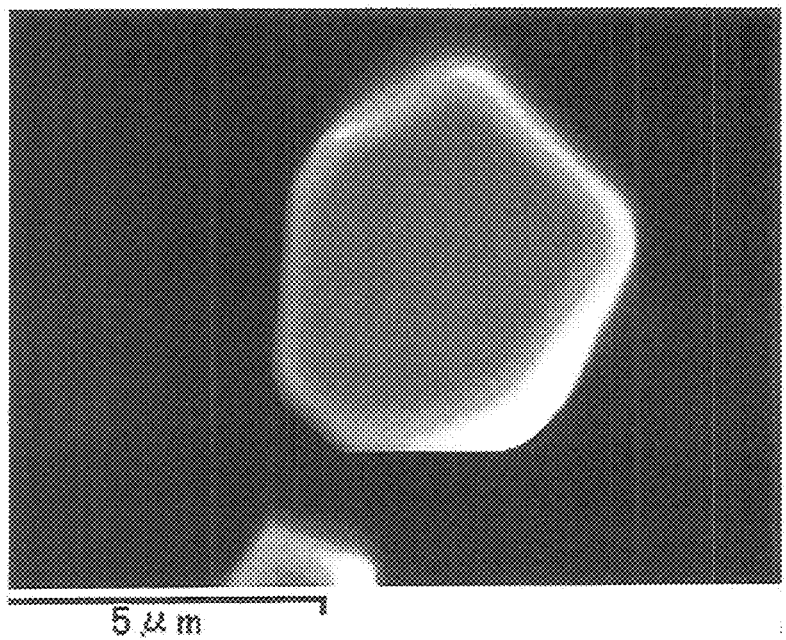
FIG. 37 is a scanning electron microscope photograph of the section of filler particles of the present disclosure obtained in example 8.
Figure 38:
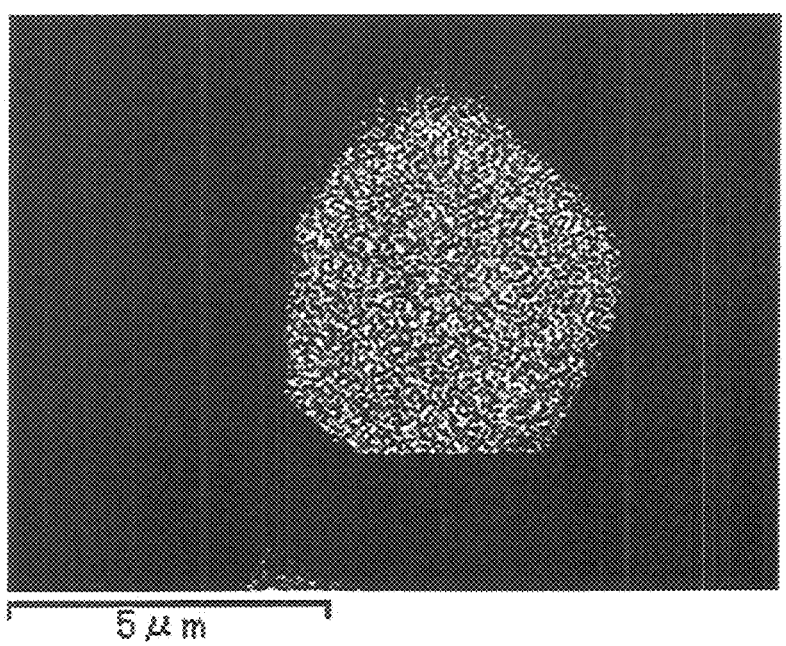
FIG. 38 is an image showing Zn mapping obtained by wavelength dispersive X-ray analysis at the section of filler particles of the present disclosure obtained in example 8.
Figure 39:
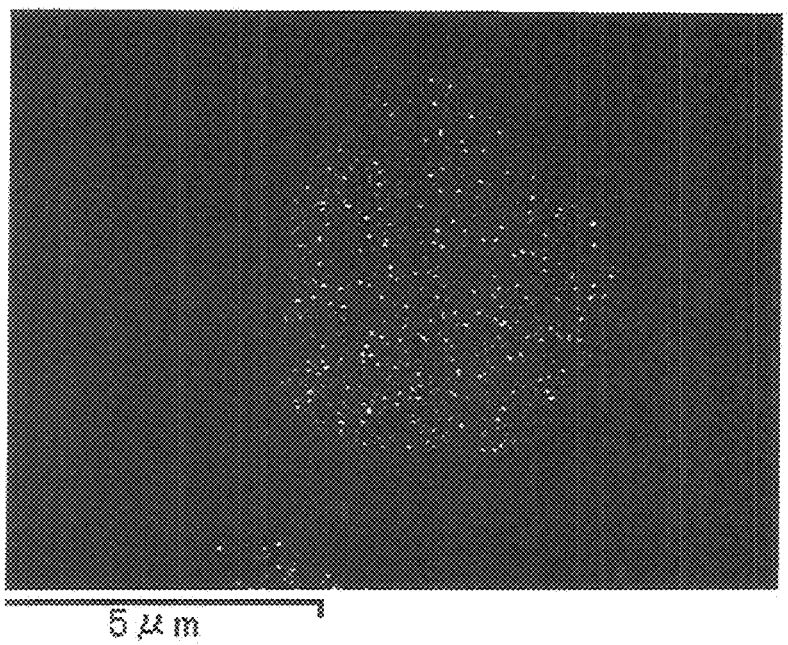
FIG. 39 is an image showing Co mapping obtained by wavelength dispersive X-ray analysis at the section of filler particles of the present disclosure obtained in example 8.
Figure 40:
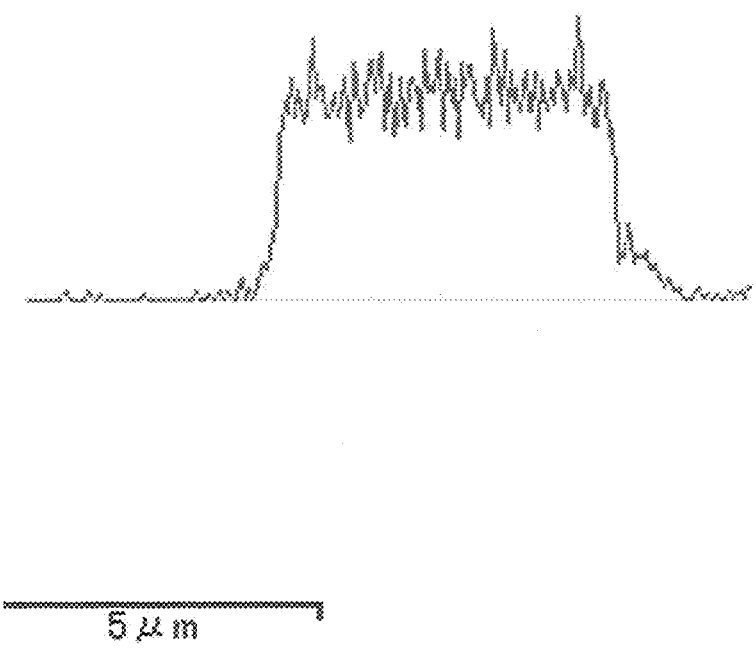
FIG. 40 is an image showing the line strength of Zn at the section of filler particles of the present disclosure obtained in example 8 determined by wavelength dispersive X-ray analysis.
Figure 41:
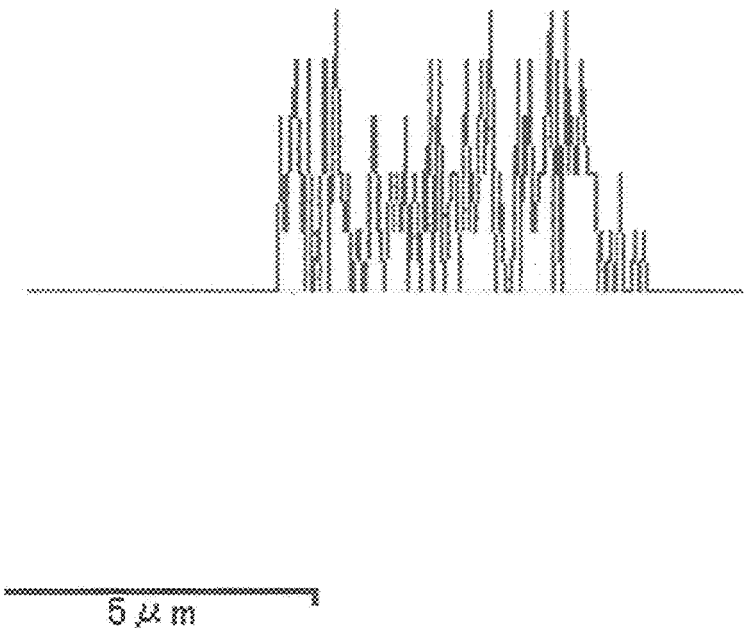
FIG. 41 is an image showing the line strength of Co at the section of filler particles of the present disclosure obtained in example 8 determined by wavelength dispersive X-ray analysis.

ZINC OXIDE SUPERFINE (manufactured by Sakai Chemical Industry, Ltd., median size (D50) 0.2 μm) 600 g and cobalt bromide hexahydrate being a compound of the metal M 133.5 g (22.25 weight % relative to the weight of the ZINC OXIDE SUPERFINE) were added into a vinyl bag to dry blend for 30 seconds. The mixed powder was put in a pot made of mullite or mullite/cordierite and calcinated at 800° C. for 3 hours. After cooling and dispersing into water 1.0 liter, this slurry was screened through a sieve of 200 mesh (opening of screen 75 μm). The slurry passing through the mesh was filtered and dried to obtain filler particles having a median size (D50) of 8.2 μm. The size and shape of the obtained zinc oxide particle were observed by scanning Electron Microscope JSM-5400 (manufactured by JEOL, Ltd.). The obtained electron microscope photograph was shown in FIG. 36.

Comparative Examples 1

ZINC OXIDE SUPERFINE (manufactured by Sakai Chemical Industry, Ltd., median size (D50) 0.2 μm) 600 g was re-pulped into water, dispersant (manufactured by KAO, Ltd., POIZ532A) 21.0 g (3.50 weight % relative to the weight of the ZINC OXIDE SUPERFINE) was added to the aqueous solution, and acetic acid being the sintering accelerator 3.66 g (0.61 weight % relative to the weight of the ZINC OXIDE SUPERFINE) was added to prepare a slurry with concentration of 600 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1200° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being sintered densely into the particle inside, being spherical and having a median size (D50) of 28.5 μm.

Comparative Examples 2

Figure 43:
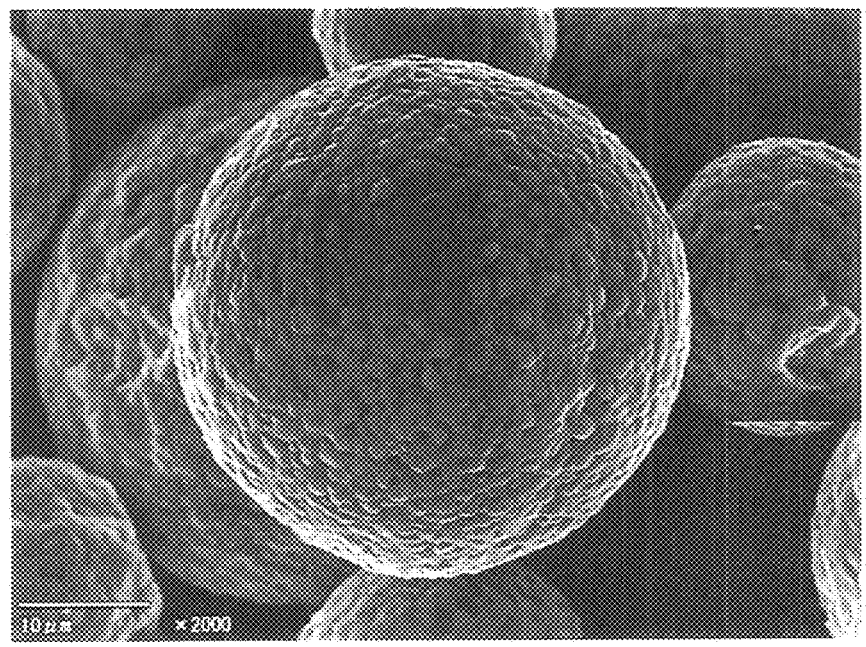
FIG. 43 is a scanning electron microscope photograph of filler particles of the present disclosure obtained in comparative example 2.
Figure 44:
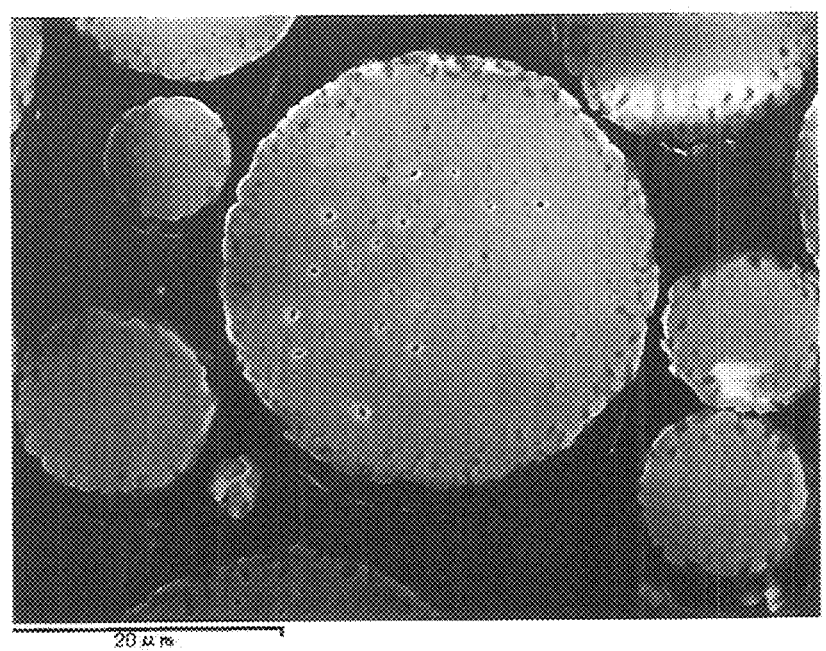
FIG. 44 is a scanning electron microscope photograph of the section of filler particles of the present disclosure obtained in comparative example 2.

ZINC OXIDE SUPERFINE (manufactured by Sakai Chemical Industry, Ltd., median size (D50) 0.2 μm) 600 g was re-pulped into water, calcium acetate monohydrate being a compound of the metal M 96.0 g (16.0 weight % relative to the weight of the ZINC OXIDE SUPERFINE) was added to the aqueous solution, and acetic acid being the sintering accelerator 3.66 g (0.61 weight % relative to the weight of the ZINC OXIDE SUPERFINE) was added to prepare a slurry with concentration of 320 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1200° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being sintered densely into the particle inside, being spherical and having a median size (D50) of 28.7 μm. The size and shape of the obtained zinc oxide particle were observed by Scanning Electron Microscope JSM-5400 (manufactured by JEOL, Ltd.). The obtained electron microscope photograph was shown in FIG. 43.

Comparative Examples 3

Figure 50:
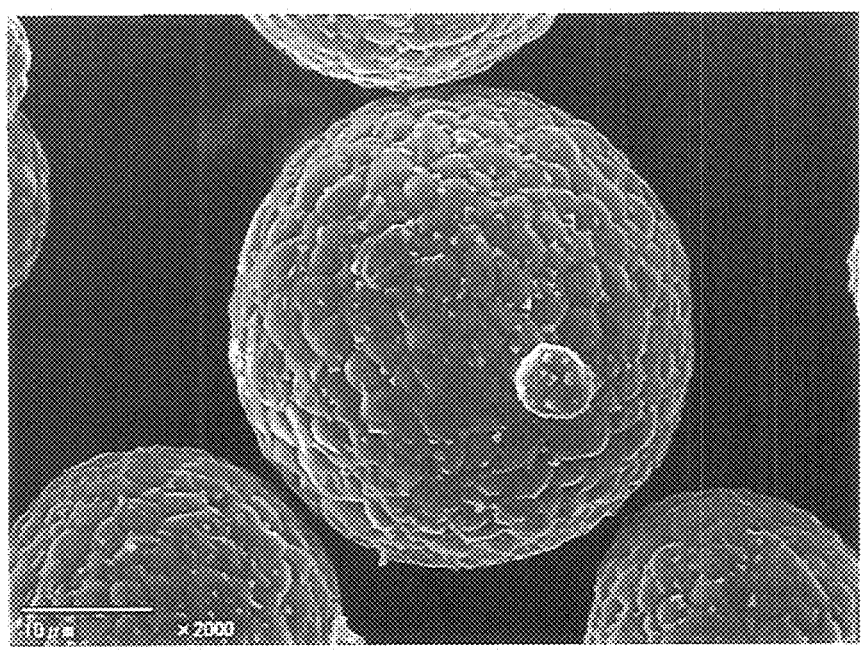
FIG. 50 is a scanning electron microscope photograph of filler particles of the present disclosure obtained in comparative example 3.
Figure 51:
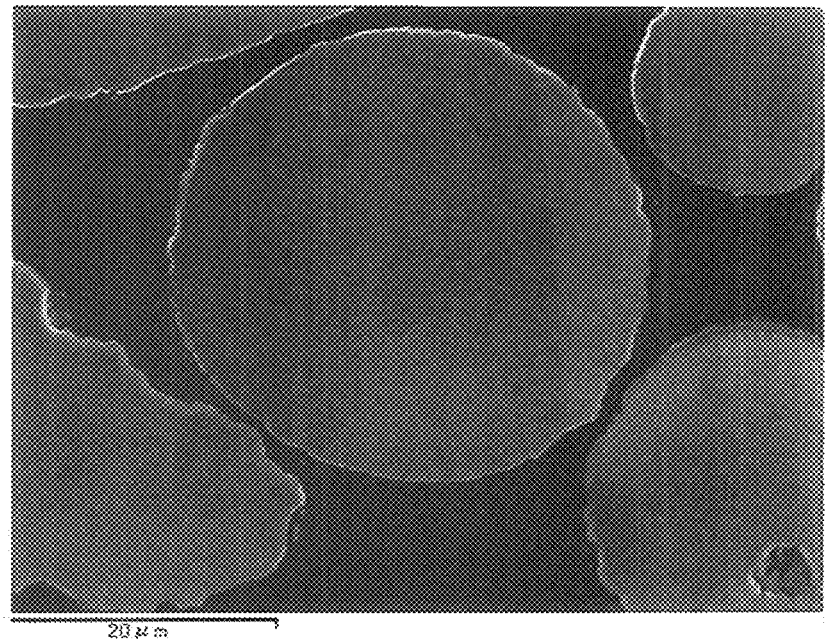
FIG. 51 is a scanning electron microscope photograph of the section of filler particles of the present disclosure obtained in comparative example 3.
Figure 52:
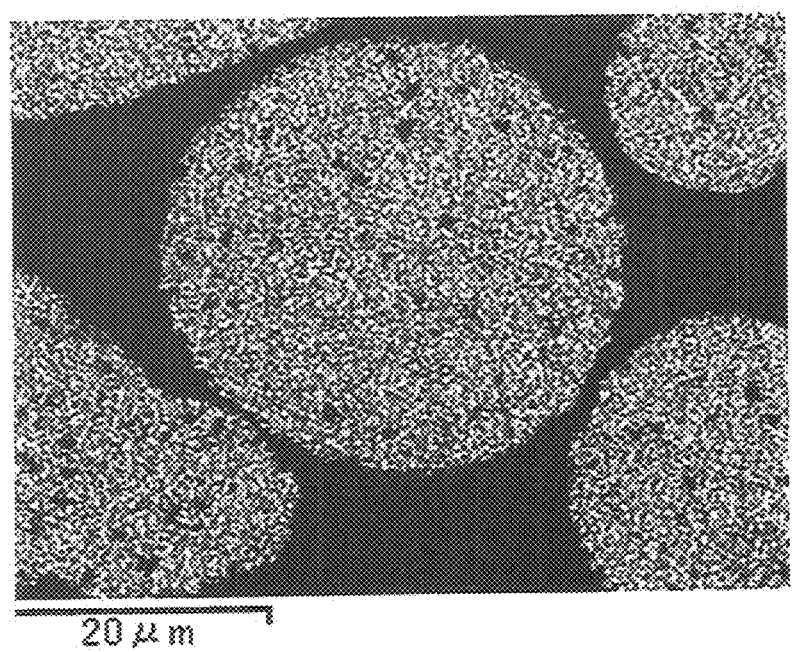
FIG. 52 is an image showing Zn mapping obtained by wavelength dispersive X-ray analysis at the section of filler particles of the present disclosure obtained in comparative example 3.
Figure 53:
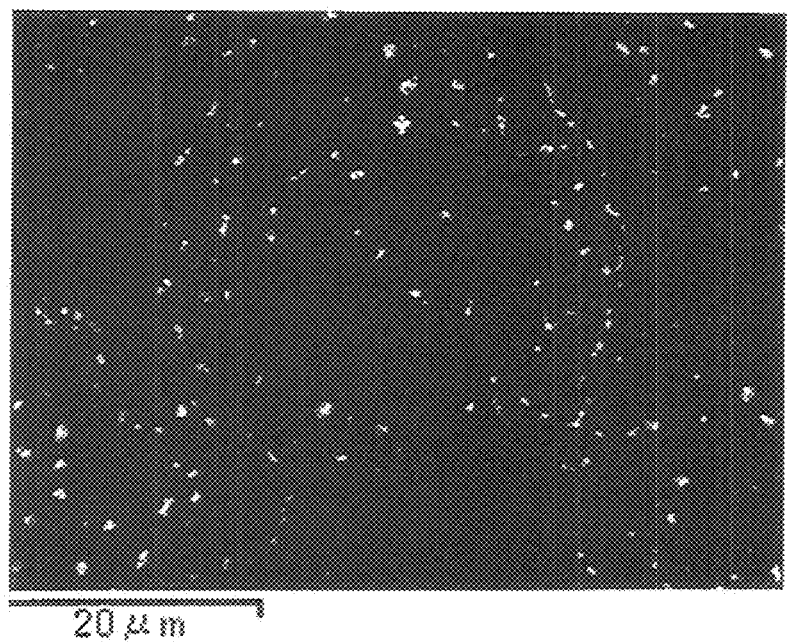
FIG. 53 is an image showing Ni mapping obtained by wavelength dispersive X-ray analysis at the section of filler particles of the present disclosure obtained in comparative example 3.
Figure 54:
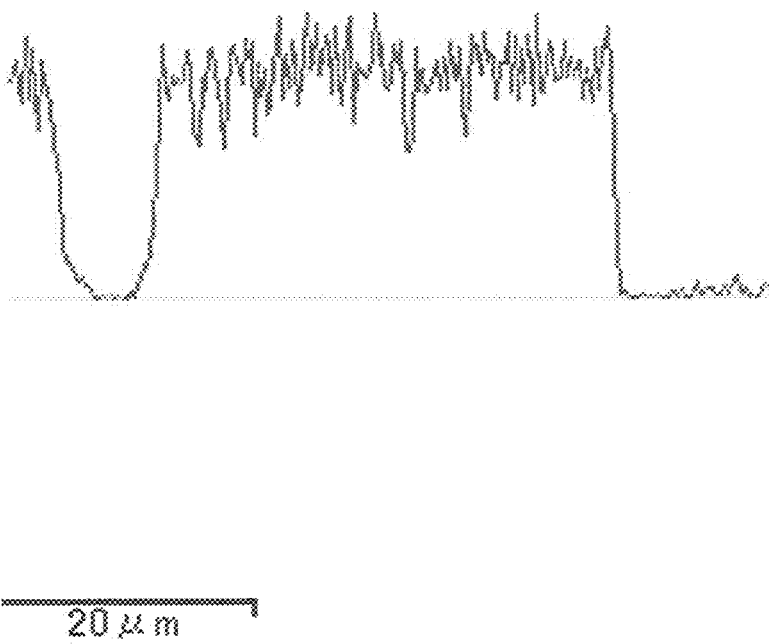
FIG. 54 is an image showing the line strength of Zn at the section of filler particles of the present disclosure obtained in comparative example 3 determined by wavelength dispersive X-ray analysis.
Figure 55:
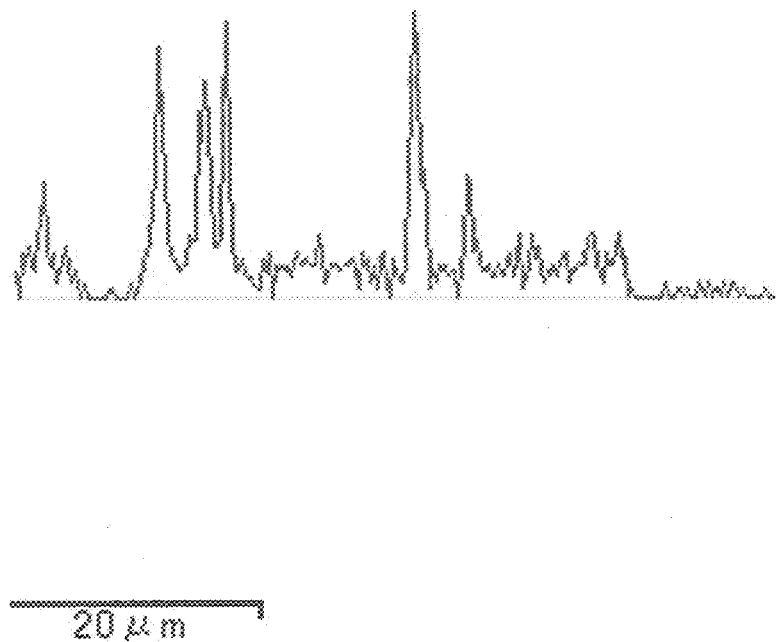
FIG. 55 is an image showing the line strength of Ni at the section of filler particles of the present disclosure obtained in comparative example 3 determined by wavelength dispersive X-ray analysis.

ZINC OXIDE SUPERFINE (manufactured by Sakai Chemical Industry, Ltd., median size (D50) 0.2 μm) 600 g was re-pulped into water, nickel acetate tetrahydrate being a compound of the metal M 102 g (17.0 weight % relative to the weight of the ZINC OXIDE SUPERFINE) was added to the aqueous solution, and acetic acid being the sintering accelerator 3.66 g (0.61 weight % relative to the weight of the ZINC OXIDE SUPERFINE) was added to prepare a slurry with concentration of 330 g/l. Next, this slurry was spray dried by using TYPE DCR LABO SPRAY DRYER (manufactured by Sakamoto Giken, Ltd.) to obtain granulated particles. These particles were put in a pot made of mullite or mullite/cordierite and static calcinated at 1200° C. for 3 hours. After cooling and dispersing into water 1.0 liter, this slurry was screened through a sieve of 200 mesh (opening of screen 75 μm). The slurry passing through the mesh was filtered and dried to obtain filler particles showing few particle fusion, being sintered densely into the particle inside, being spherical and having a median size (D50) of 33.3 μm. The size and shape of the obtained zinc oxide particle were observed by Scanning Electron Microscope JSM-5400 (manufactured by JEOL, Ltd.). The obtained electron microscope photograph was shown in FIG. 50.

The filler particles of examples and comparative examples were evaluated according to the following criteria, and the results were showed in tables 1 and 2.

(Median Size (D50), D10, D90)

Filler particles 1.0 g weighed were dispersed into 0.025 weight % sodium hexametaphosphate aqueous solution 100 ml. The obtained dispersion liquid was charged into measurement bath of laser diffraction/scattering particle size distribution analyser LA-750 (manufactured by HORIBA, Ltd.) filled with 0.025 weight % sodium hexametaphosphate aqueous solution and measured under the conditions that circulation speed: 15, ultrasonic wave strength: 7, and ultrasonic wave time: 3 minutes. Median size (D50), D10 and D90 were decided while setting relative refractive index at 1.5 because refractive index of zinc oxide was 1.9 to 2.0 and that of water was 1.3 at room temperature.

(Aspect Ratio)

In the 100 particles in the electron microscope photograph taken by Scanning Electron Microscope JSM-5400 (manufactured by JEOL, Ltd.), long length and short length passing through the center of each particle were measured by a scale and ratio was decided by dividing long length by short length. The aspect ratio was decided by averaging the as ratios. Further, aspect ratios of 250 particles were measured and number ratio (%) of particles having aspect ratio of 1.10 or less was calculated.

(Density)

Weight a (g) of 100 ml Gay-Lussac type pycnometer that had washed and dried was weighed to the digit of 0.1 mg, distilled water was charged to the gauge line, and the weight b (g) of the pycnometer was weighed to the digit of 0.1 mg. Next, after the Gay-Lussac type pycnometer was dried, sample 5 g was charged and weight c (g) of the sample was calculated by weighing the pycnometer. Distilled water was charged until the sample was covered and air contained in the distilled water was removed in vacuum desiccators. Distillated water was charged to the gauge line and the weight a (g) of the pycnometer was weighed to the digit of 0.1 mg to calculate the density according to the following formula.

$$\text{Density (g/cm}^3) = c/((b-a)+c-(d-a))$$

(Apparent Density)

Apparent density was measured by JIS K 5101-12-1 test methods for pigment-apparent density or apparent specific volume (static method).

(Tap Bulk Density)

Tap bulk density was measured with JIS R 1639-2.

(Filling Rate of Filler)

(i) EEA resin (REXPEARL A1150 manufactured by Japan Polyethylene Corporation, Ltd.) and filler particles of Examples 1 to 8, and (ii) EEA resin and filler particles of Comparative Examples 1 to 3 were mixed as shown in tables 1 and 2. The filling rate of filler (volume %) was calculated supposing that specific gravity of the EEA resin was 0.945, and specific gravity of the zinc oxide particle was 5.55. Having set weight of filler as a (g), specific gravity of the filler as A, weight of the EEA resin as b (g), and specific gravity of the EEA resin as B, filling rate of filler (volume %) was calculated according to the following formula.

$$\text{Filling rate of filler (volume \%)} = (a/A)/(a/A+b/B) \times 100$$

(Making of Sheet of Resin Composition)

(i) EEA resin and filler particles of Examples 1 to 8, and (ii) EEA resin and filler particles of Comparative examples 1 to 3 were heated and mixed in LABO PLASTMILL (manufactured by TOYO SEIKI SEISAKU-SYO, Ltd.) at the number of rotations of 40 rpm and 150° C. for 10 minutes at rate of filling rate of filler (volume %) as shown in Tables 1 and 2. The mixtures of the filler and the resin were taken out and put on a center of a stainless-steel casting mold with 2 mm thickness (1.50 mm×200 mm). It was nipped with two stainless-steel plates (200 mm×300 mm) from above and below and put on specimen support of MINI TEST PRESS-10 (manufactured by TOYO SEIKI SEISAKU-SYO, Ltd.) followed by pressuring at 150° C. and 0.5 MPa for 5 minutes and then pressuring at 150° C. and 25 MPa for 3 minutes. Next, the casting mold was put on the specimen support of Steam Press Machine (manufactured by Gonno Yuatsuki Seisakusyo, Ltd.) and then it was cooled at 25 MPa with running coolant water for 5 minutes to obtain a sheet of resin composition after pressuring to 25 MPa with passing steam and heating.

(Specific Volume Resistance Value)

The obtained sheet was put in a constant-temperature oven set at 30° C. and left for 30 minutes or more. Then, the sheet was put between a negative electrode plate made of brass with 70 mm φ and a positive electrode plate made of brass with 100 mm φ. Next, volume resistance was measured after applying 500 V direct current and charging for a minute. It was measured by using digital ultrahigh resistance/micro ammeter (manufactured by ADC Corporation Ltd.). Specific volume resistance value σ(Ω·cm) was calculated according to the following formula.

$$\sigma = \pi d^2 / 4t \times Ru$$

t: thickness of test piece (sheet) (cm)
d: diameter of innermost electrode
Ru: volume resistance (Ω)

(Heat Conductivity)

Next, the sheet was cut out to be a molded article of 55 mmφ and 2.0 mm thickness by punch and the heat conductivity was measured following setting on the specimen support of AUTOΛ HC-110 (manufactured by EKO instruments Co., Ltd, the method with heat flow meter). AUTOΛ HC-110 was calibrated by using Pyrex standard plate with 6.45 mm thickness before measurement. Heat conductivity (W/m·K) when reached a condition of thermal equilibrium at 25° C. was measured by measuring while a high temperature heater was set at 35° C. and low temperature heater was set at 15° C. The results were shown in Tables 1 and 2.

TABLE 1

| | Example | | | |
|---|---|---|---|---|
| | 1 | 2 | 3 | 4 |
| Added reagent (Compound of metal M/ Sintering accelerator) | Magnesium acetate tetrahydrate/— | Cobalt acetate tetrahydrate/Acetic acid | Lithium acetate/ Acetic acid | Potassium acetate/— |
| Addition amount of compound of metal M | 26.9 weight % relative to zinc oxide (5.0 weight % in terms of MgO) | 10.3 weight % relative to zinc oxide (3.0 weight % in terms of CoO) | 0.5 weight % relative to zinc oxide (0.23 weight % in terms of $Li_2O$) | 1.0 weight % relative to zinc oxide 0.96 weight % in terms of $K_2O$) |
| Addition amount of sintering accelerator | | 0.61 weight % relative to zinc oxide | 0.61 weight % relative to zinc oxide | |
| Addition amount of dispersant (POIZ 532A) | 3.50 weight % relative to zinc oxide | | 3.50 weight % relative to zinc oxide | 3.50 weight % relative to zinc oxide |
| Concentration of slurry (g/l) | 590 | 340 | 500 | 1470 |
| Calcinating temperature/ Calcinating time | 1200° C./3 hours | 1200° C./3 hours | 1000° C./3 hours | 1000° C./3 hours |
| Median size D50 (μm) | 29.0 | 31.7 | 31.9 | 34.4 |
| D10 (μm) | 19.0 | 21.1 | 20.5 | 20.2 |
| D90 (μm) | 45.2 | 49.2 | 50.6 | 56.6 |
| D90/D10 | 2.4 | 2.3 | 2.5 | 2.8 |
| Aspect ratio | 1.04 | 1.04 | 1.01 | 1.06 |
| Ratio of particles having aspect ratio of 1.10 or less in 250 particles (%) | 95 | 95 | 95 | 96 |
| Density (g/cm$^2$) | 5.05 | 5.01 | 4.85 | 4.84 |
| Apparent density (g/ml) | 2.56 | 2.81 | 2.85 | 2.84 |
| Tap bulk density (g/cm$^3$) | 3.43 | 3.56 | 3.32 | 3.51 |
| Filling ratio of filler (volume %) | 63.3 | 62.9 | 62.9 | 62.9 |
| Heat conductivity (W/m · K) | 2.8 | 3.2 | 3.0 | 3.0 |
| Specific volume resistance value (Ω · cm) | $3.7 \times 10^{13}$ | $2.1 \times 10^{14}$ | $1.1 \times 10^{13}$ | $5.1 \times 10^{12}$ |

| | Example | | | |
|---|---|---|---|---|
| | 5 | 6 | 7 | 8 |
| Added reagent (Compound of metal M/ Sintering accelerator) | Sodium acetate/— | Copper acetate (I/ Acetic acid | Magnesium chloride hexahydrate/ Ammonium bromide | Cobalt bromide hexahydrate/— |
| Addition amount of compound of metal M | 3.38 weight % relative to zinc oxide (2.5 weight % in terms of $Na_2O$) | 5.84 weight % relative to zinc oxide (5.0 weight % in terms of $Cu_2O$) | 28.0 weight % relative to zinc oxide (5.0 weight % in terms of MgO) | 22.25 weight % relative to zinc oxide (8.0 weight % in terms of CoO) |
| Addition amount of sintering accelerator | | 0.50 weight % relative to zinc oxide | 1.00 weight % relative to zinc oxide | |
| Addition amount of dispersant (POIZ 532A) | 3.50 weight % relative to zinc oxide | 3.50 weight % relative to zinc oxide | | |
| Concentration of slurry (g/l) | 690 | 240 | | |
| Calcinating temperature/ Calcinating time | 1100° C./3 hours | 1150° C./3 hours | 1000° C./3 hours | 800° C./3 hours |
| Median size D50 (μm) | 33.4 | 28.7 | 9.1 | 8.2 |
| D10 (μm) | 21.4 | 17.5 | 3.6 | 3.1 |
| D90 (μm) | 51.4 | 45.0 | 13.6 | 12.1 |
| D90/D10 | 2.4 | 2.6 | 3.8 | 3.9 |
| Aspect ratio | 1.02 | 1.03 | 1.57 | 1.52 |
| Ratio of particles having aspect ratio of 1.10 or less in 250 particles (%) | 95 | 93 | 7 | 5 |
| Density (g/cm$^2$) | 4.87 | 4.32 | 5.29 | 5.31 |
| Apparent density (g/ml) | 2.83 | 2.56 | | |
| Tap bulk density (g/cm$^3$) | 3.40 | 3.28 | | |
| Filling ratio of filler (volume %) | 62.9 | 62.9 | 62.9 | 62.9 |
| Heat conductivity (W/m · K) | 3.1 | 3.3 | 2.0 | 2.4 |
| Specific volume resistance value (Ω · cm) | $1.3 \times 10^{13}$ | $2.3 \times 10^{13}$ | $9.4 \times 10^{12}$ | $3.1 \times 10^{13}$ |

TABLE 2

| | Comparative Example | | |
|---|---|---|---|
| | 1 | 2 | 3 |
| Added reagent (Compound of / Metal M Sintering accelerator) | —/Acetic acid | Calcium acetate monohydrate/ Acetic acid | Nickel acetate tetrahydrate/ Acetic acid |
| Addition amount of compound of metal M | | 16.0 weight % relative to zinc oxide (5.0 weight % in terms of CaO) | 17.0 weight % relative to zinc oxide (5.0 weight % in terms of NiO) |
| Addition amount of sintering accelerator | 0.61 weight % relative to zinc oxide | 0.61 weight % relative to zinc oxide | 0.61 weight % relative to zinc oxide |
| Addition amount of dispersant (POIZ 532A) | 3.50 weight % relative to zinc oxide | | |
| Concentration of slurry (g/l) | 600 | 320 | 330 |
| Calcinating temperature/ Calcinating time | 1200° C./ 3 hours | 1200° C./ 3 hours | 1200° C./ 3 hours |
| Median size D50 (μm) | 28.5 | 28.7 | 33.3 |
| D10 (μm) | 17.7 | 18.3 | 21.9 |
| D90 (μm) | 47.4 | 46.0 | 52.2 |
| D90/D10 | 2.7 | 2.5 | 2.4 |
| Aspect ratio | 1.02 | 1.03 | 1.05 |
| Ratio of particles having aspect ratio of 1.10 or less in 250 particles (%) | 96 | 95 | 95 |
| Density (g/cm$^3$) | 4.78 | | 4.61 |
| Apparent density (g/ml) | 2.81 | 2.24 | 2.59 |
| Tap bulk density (g/cm$^3$) | 3.50 | 2.81 | 3.41 |
| Filling rate of filler (volume %) | 62.9 | 62.9 | 62.9 |
| Heat conductivity (W/m · K) | 3.3 | 2.3 | 2.0 |
| Specific volume resistance value (Ω · cm) | $1.1 \times 10^{10}$ | $3.7 \times 10^{11}$ | $3.2 \times 10^{12}$ |

From the results of examples and comparative examples, it was found that the filler particles of the present disclosure, being filler particles in which the metal M existed uniformly inside the particle, had superior heat conductivity and showed good insulation property. In this way, the filler particles forming a solid solution in which the metal M uniformly-exists inside the particle are superior especially in the insulation property, and have better insulation property than the filler particles not forming a solid solution and in which the metal M does not exist uniformly.

(Cutting of Sheet of Resin Composition)

The sheet of the resin composition was cut by using a cross section polisher (manufactured by JEOL, Ltd.). The sheet of the resin composition containing the filler particles prepared as mentioned above was cut so that the thickness became 1 mm or less, and next the sheet was cut by radiating Ar ion beam vertically to the thin film with etching.

Concerning the section of the obtained filler particle, the observation by scanning electron microscope JSM-7000 F (manufactured by JEOL, Ltd.), the mapping and the line analysis by a wavelength dispersive X-ray analysis, and the quantitative analysis by an energy dispersive X-ray analysis according to the measurement method described in detail below were conducted. The images of results of mapping and line strength analysis were shown in FIGS. 3 to 6 (example 1); FIGS. 10 to 13 (example 2); FIGS. 19 to 22 (example 5); FIGS. 25 to 28 (example 6); FIGS. 31 to 34 (example 7); FIGS. 38 to 41 (example 8); FIGS. 45 to 48 (comparative example 2); FIGS. 52 to 55 (comparative example 3). Further, the results of quantitative analysis by an energy dispersive X-ray analysis were shown in table 3.

(Mapping of Zn and Metal M)

Zn and metal M of the section of the filler particles was mapped by scanning electron microscope JSM-7000 F (manufactured by JEOL, Ltd.) in a wavelength dispersive X-ray analysis mode, and the image analysis was conducted by using the analysis software INCA (manufactured by Oxford Instruments).

(Line Strength Analysis of Zn and Metal M)

The line strength analysis of Zn and metal M at the section of the filler particles was displayed by mapping by scanning electron microscope JSM-7000 F (manufactured by JEOL, Ltd.) in a wavelength dispersive X-ray analysis mode and image analysis the strength of Zn and metal M detected on a straight line in the center of the resulting mapping image by using an analysis software INCA (manufactured by Oxford Instruments).

(Quantitative Analysis of Zn and Metal M, Method for Measuring Δ(%))

The quantitative analysis of Zn and metal M at the section of the filler particle was displayed by mapping the section of the filler particle by scanning electron microscope JSM-7000 F (manufactured by JEOL, Ltd.) in a wavelength dispersive X-ray analysis mode and displaying the quantitative analysis value in every squares formed on the image by using an analysis software INCA (manufactured by Oxford Instruments).

Figure 14:
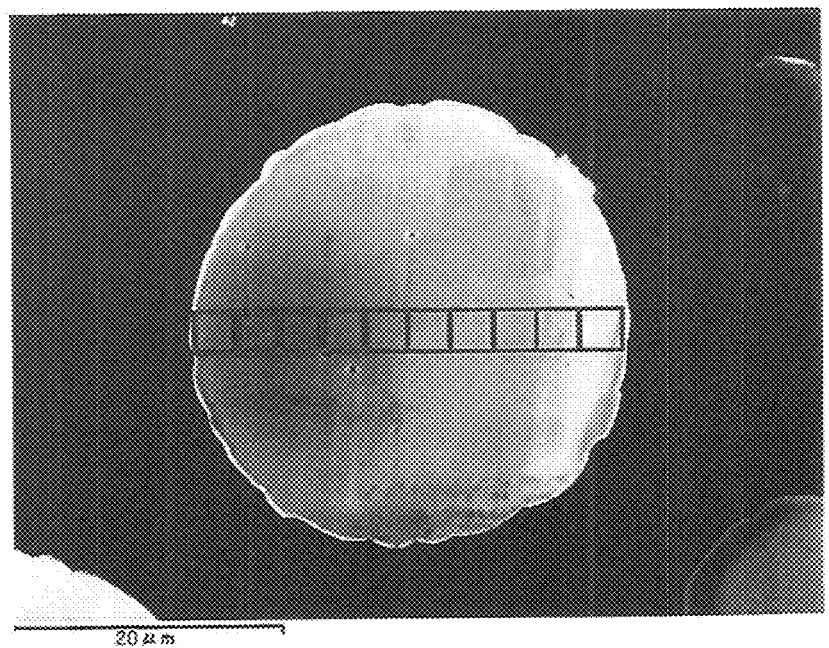
FIG. 14 is an image showing the part where a quantitative analysis of Zn and Co at the section of filler particles of the present disclosure obtained in example 2 was performed by energy dispersive X-ray analysis.
Figure 35:
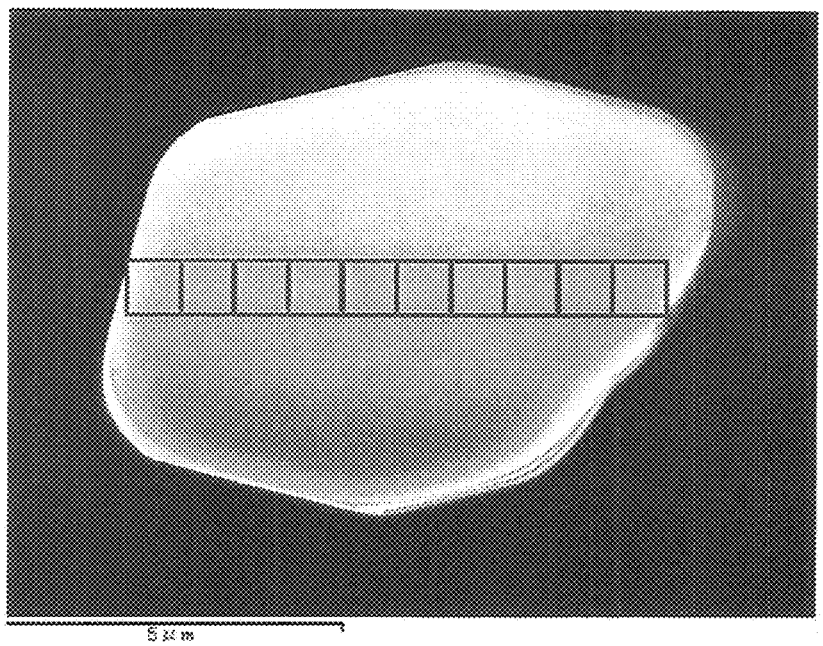
FIG. 35 is an image showing the part where a quantitative analysis of Zn and Mg at the section of filler particles of the present disclosure obtained in example 7 was performed by energy dispersive X-ray analysis.
Figure 42:
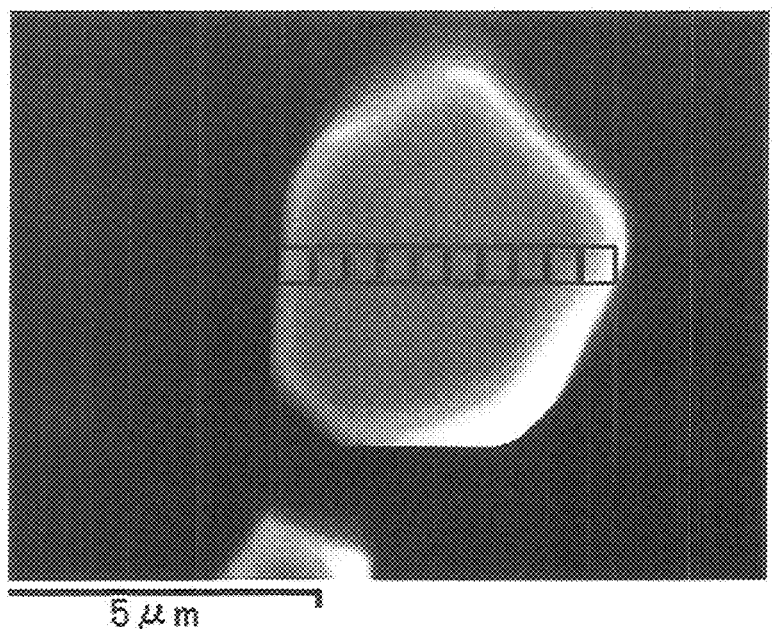
FIG. 42 is an image showing the part where a quantitative analysis of Zn and Co at the section of filler particles of the present disclosure obtained in example 8 was performed by energy dispersive X-ray analysis.
Figure 49:
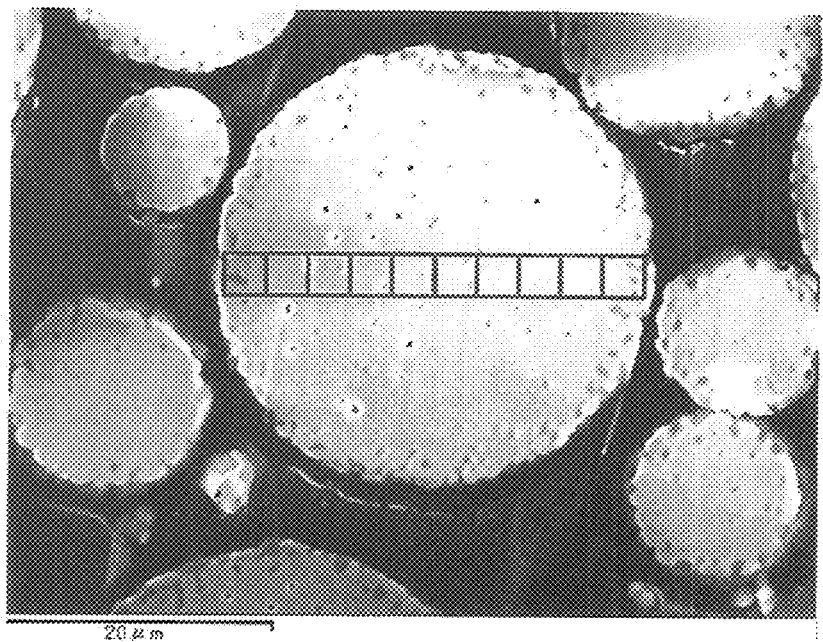
FIG. 49 is an image showing the part where a quantitative analysis of Zn and Ca at the section of filler particles of the present disclosure obtained in comparative example 2 was performed by energy dispersive X-ray analysis.
Figure 56:
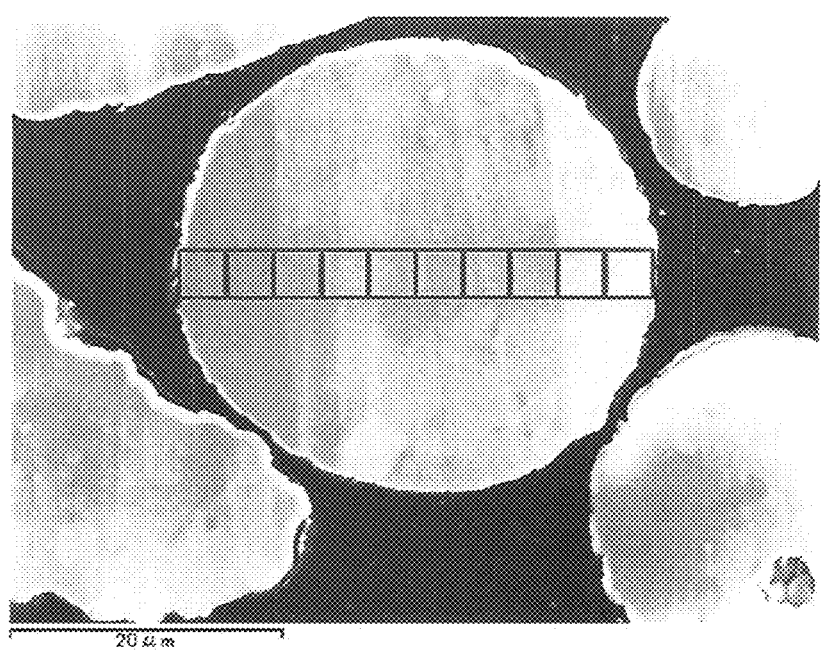
FIG. 56 is an image showing the part where a quantitative analysis of Zn and Ni at the section of filler particles of the present disclosure obtained in comparative example 3 was performed by energy dispersive X-ray analysis

In FIG. 7 (example 1), FIG. 14 (example 2), FIG. 35 (example 7), FIG. 42 (example 8), FIG. 49 (comparative example 2), and FIG. 56 (comparative example 3), 10 squares delimited diametrically were numbered as 1, 2, 3, 4, 5, 6, 7, 8, 9, and 10 from the left side in every figure, and the quantitative analysis values (weight %) were decided by quantifying the content of Zn and metal M from the detected strength of Zn and metal M in every square. Next, the quantitative analysis value Q (weight %) of metal M in terms of oxide relative to 100 weight % of ZnO in every square was decided from the quantitative analysis value (weight %) of Zn and metal M in every square. Further, the difference between the quantitative analysis value Q (weight %) of metal M in terms of oxide relative to 100 weight % of ZnO in squares 1 to 10 and the average value A (weight %) of the quantitative analysis value of metal M in terms of oxide in squares: 1 to 10: Δ (%) were decided by next formula.

$$\Delta(\%) = |Q - A|/A \times 100$$

In this formula,

Q; the quantitative analysis value (weight %) of metal M in terms of oxide relative to 100 weight % of ZnO in every square 1 to 10

A; the average value of the quantitative analysis values (weight %) of metal M in terms of oxide relative to 100 weight % of ZnO in every square 1 to 10

The results were shown in table 3.

TABLE 3

|  | Example 1 | | Example 2 | | Example 7 | |
| --- | --- | --- | --- | --- | --- | --- |
|  | MgO quantitative analysis value Q relative to 100 weight % of ZnO in squares 1 to 10 (weight %) | Difference Δ (%) between MgO quantitative analysis value Q and average value A in squares 1 to 10 | CoO quantitative analysis value Q relative to 100 weight % of ZnO in squares 1 to 10 (weight %) | Difference Δ (%) between CoO quantitative analysis value Q and average value A in squares 1 to 10 | MgO quantitative analysis value Q relative to 100 weight % of ZnO in squares 1 to 10 (weight %) | Difference Δ (%) between MgO quantitative analysis value Q and average value A in squares 1 to 10 |
| Square No. 1 | 4.44 | 1.8 | 2.01 | 31.5 | 1.17 | 45.5 |
| Square No. 2 | 3.14 | 30.6 | 1.38 | 53.1 | 0.84 | 3.9 |
| Square No. 3 | 5.83 | 28.8 | 1.74 | 40.9 | 0.85 | 5.3 |
| Square No. 4 | 4.94 | 9.2 | 3.67 | 25.0 | 0.52 | 36.0 |
| Square No. 5 | 3.94 | 12.9 | 4.63 | 57.6 | 0.45 | 44.2 |
| Square No. 6 | 4.77 | 5.3 | 1.34 | 54.2 | 0.53 | 33.7 |
| Square No. 7 | 4.26 | 5.9 | 3.79 | 29.2 | 1.14 | 41.0 |
| Square No. 8 | 6.13 | 35.5 | 4.63 | 57.7 | 0.65 | 18.9 |
| Square No. 9 | 4.32 | 4.5 | 2.82 | 4.1 | 1.29 | 59.7 |
| Square No. 10 | 3.48 | 23.0 | 3.35 | 14.3 | 0.62 | 22.7 |
| Average value A of the quantitative analysis values Q in squares 1 to 10 (weight %) | 4.53 | | 2.94 | | 0.81 | |

|  | Example 8 | | Comparative example 2 | | Comparative example 3 | |
| --- | --- | --- | --- | --- | --- | --- |
|  | CoO quantitative analysis value Q relative to 100 weight % of ZnO in squares 1 to 10 (weight %) | Difference Δ (%) between CoO quantitative analysis value Q and average value A in squares 1 to 10 | CaO quantitative analysis value Q relative to 100 weight % of ZnO in squares 1 to 10 (weight %) | Difference Δ (%) between CaO quantitative analysis value Q and average value A in squares 1 to 10 | NiO quantitative analysis value Q relative to 100 weight % of ZnO in squares 1 to 10 (weight %) | Difference Δ (%) between NiO quantitative analysis value Q and average value A in squares 1 to 10 |
| Square No. 1 | 1.43 | 35.3 | 16.18 | 323.0 | 4.70 | 11.8 |
| Square No. 2 | 1.72 | 22.3 | 0.10 | 97.3 | 6.11 | 14.8 |
| Square No. 3 | 2.60 | 17.7 | 0.92 | 76.1 | 9.02 | 69.5 |
| Square No. 4 | 2.61 | 18.0 | 0.88 | 76.9 | 6.10 | 14.5 |
| Square No. 5 | 2.67 | 20.5 | 1.41 | 63.0 | 3.36 | 36.9 |
| Square No. 6 | 1.44 | 35.0 | 1.58 | 58.7 | 7.69 | 44.5 |
| Square No. 7 | 2.88 | 29.9 | 1.53 | 59.9 | 0.26 | 95.2 |
| Square No. 8 | 3.01 | 35.8 | 1.66 | 56.5 | 5.86 | 10.0 |
| Square No. 9 | 1.92 | 13.4 | 0.75 | 80.3 | 2.10 | 60.5 |
| Square No. 10 | 1.86 | 15.8 | 13.22 | 245.6 | 8.04 | 51.0 |
| Average value A of the quantitative analysis values Q in squares 1 to 10 (weight %) | 2.21 | | 3.82 | | 5.32 | |

From the results in table 3, it was clear that Δ(%); the difference of metal M relative to the average value in every square 1 to 10 about the filler particles obtained by adding Mg or Co in examples 1, 2, 7, and 8 were less than 60(%), so the metal M was uniformly-distributed inside the zinc oxide particles to become in a solid solution state.

On the other hand, it was clear that Δ(%); the difference of metal M relative to the average value in every square 1 to 10 about the filler particles obtained by adding Ca or Ni in comparative examples 2 and 3 were 60(%) or more, so the metal M was eccentrically-located at the surface layer of the zinc oxide particle or inside the particle not to become in an uniform solid solution state.

Furthermore, form the results of every figure, it was clear that the metal M was uniformly-distributed inside the filler particles so that the filler particle of the present disclosure became in a solid solution state, on the other hand, that the metal M was eccentrically-located at the surface layer of the zinc oxide particle or inside the particle so that the filler particle of comparative examples did not become in an uniform solid solution state.

INDUSTRIAL APPLICABILITY

The filler particle of the present disclosure can be suitably used for various uses of filler. For example, it can be added to a resin composition, grease, a coating composition and so on.

It can be used especially for the use that requests the heat releasing property and the insulation property.

The invention claimed is:

1. A filler particle comprising a composite zinc oxide expressed by the following chemical formula (1):

$$Zn_xM_yO \tag{1}$$

in the formula, M is at least one selected from the group consisting of Mg, Co, Li, K, Na and Cu, and $x+ny/2=1$ when the valence of M is n, and wherein n and y satisfy the following relational expression:

$$0.0001 < ny/2 < 0.3,$$

the filler particle having a median size (D50) within the range of 1 to 10,000 μm.

2. A resin composition comprising the filler particle according to claim 1.

3. A grease comprising the filler particle according to claim 1.

4. A coating composition comprising the filler particle according to claim 1.

* * * * *